United States Patent
Abuelhaija et al.

(10) Patent No.: US 11,579,223 B1
(45) Date of Patent: Feb. 14, 2023

(54) MAGNETIC RESONANCE IMAGING MEDICAL DEVICE

(71) Applicant: Imam Abdulrahman Bin Faisal University, Dammam (SA)

(72) Inventors: Ashraf Abuelhaija, Dammam (SA); Gameel Saleh Mohammed Saleh, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 0 days.

(21) Appl. No.: 17/958,121

(22) Filed: Sep. 30, 2022

Related U.S. Application Data

(63) Continuation of application No. 17/307,595, filed on May 4, 2021, now Pat. No. 11,493,578.

(51) Int. Cl.
    *G01R 33/36* (2006.01)
(52) U.S. Cl.
    CPC ..... *G01R 33/3628* (2013.01); *G01R 33/3642* (2013.01)
(58) Field of Classification Search
    CPC .............. G01R 33/543; G01R 33/5608; G01R 33/4828; G01R 33/3415; G01R 33/283; G01R 33/307; G01R 33/60; G01V 3/32; E21B 49/08; E21B 2049/085; G01N 24/10
    See application file for complete search history.

(56) References Cited

U.S. PATENT DOCUMENTS

| | | | |
|---|---|---|---|
| 2004/0266362 A1 | 12/2004 | Watkins et al. | |
| 2013/0083703 A1* | 4/2013 | Granger-Jones | H03H 7/463 370/277 |
| 2016/0003753 A1* | 1/2016 | Augustine | G01R 33/30 324/309 |
| 2017/0070205 A1* | 3/2017 | Hashemi | H03H 9/725 |

(Continued)

OTHER PUBLICATIONS

Transmit/Receive Switch for Quadrrature Coils in a 7-Tesla Magnetic Resonance Imaging System(MRI) ; Liu, et al. ; Jul. 9, 2012 (PDF Creation Date) ; 37Pages.

(Continued)

*Primary Examiner* — Jermele M Hollington
*Assistant Examiner* — Taqi R Nasir
(74) *Attorney, Agent, or Firm* — Oblon, McClelland, Maier & Neustadt, L.L.P.

(57) ABSTRACT

A magnetic resonance imaging apparatus includes a T/R switch. The T/R switch includes a double sided microstripline based hybrid couplers with a top side and a bottom side each including two concentric microstripline based hybrid couplers. Each of the two concentric microstripline based hybrid couplers includes an inner microstripline based hybrid coupler and an outer microstripline based hybrid coupler. The inner microstripline based hybrid coupler forms an inner loop of the two concentric microstripline based hybrid couplers and the outer microstripline based hybrid coupler forms an outer loop. In a transmission mode, the inner microstripline based hybrid coupler and the outer microstripline based hybrid coupler at the top side of the dual-tuned T/R switch are activated. In a receiving mode the inner microstripline based hybrid coupler and the outer microstripline based hybrid coupler at the top side and at the bottom side of the dual-tuned T/R switch are activated.

9 Claims, 27 Drawing Sheets

(56) References Cited

U.S. PATENT DOCUMENTS

2018/0083591 A1   3/2018  Mandegaran
2018/0331671 A1*  11/2018 Jian ..................... H03H 7/463

OTHER PUBLICATIONS

Design and Development of a General-Purpose Transmit/Receive (T/R) Switch for 3T MRI, Compatible for a Linear, Quadrature and Double-Tuned RF Coll ; Thapa, et al. ; Concepts Magn Reson Part B (Magn Reson Engineering) vol. 46B(2) ; pp. 56-65 ; Mar. 3, 2016; 10 Pages.
Directional Coupler ; Wu, et al. ; The Electrical Engineering Handbook ; 2005 ; 17 Pages.
Multi-tuned RF Coil using Microfluidically Tunable RF Capacitor for MRI/MRS at 7T; Abuelhaija, et al. ; International Journal on Communications Antenna and Propogation (IRECAP) ; Nov. 11, 2019 ; 3 Pages ; Abstract Only.
Double-layered dual-tuned RF coil using frequency-selectable PIN-diode control at 7-T MRI; Han, et al. ; Concepts in Magnetic Resonance Part B: Magnetic Resonance Engineering / vol. 47B, Issue 4 ; May 21, 2018 ; 15 Pages.
A Dual 1H/31P Quadrature Microstripline-Based Transmit/Receive Switch for 7 Tesla MRI ; Abuelhaija, et al. ; International Journal of Electrical and Computer Engineering (IJECE) ; Apr. 2018 ; 7 Pages.
Symmetrical and Unsymmetrical Microstripline-based Transmit/Receive Switches for 7 Tesla Magnetic Resonance Imaging ; Abuelhaija, et al. ; IEEE Transactions on Biomedical Circuits and Systems. ; Aug. 8, 2020 ; 7 Pages.
A Pi-Shaped Compact Dual Tuned 1H/23Na Microstripiine-Based Switch for 7Tesla MRI ; Abuelhaija, et al. ; International Journal on Communications Antenna and Propagation (IRECAP) ; Jun. 2020 ; 7 Pages.
Dual-Tuned Microstripline-Based T/R Switch for 7-Tesla Magnetic Resonance Imaging ; Preprint submitted to Journal of Latex Templates ; Feb. 1, 2021 ; 7 Pages.

* cited by examiner

MAGNETIC RESONANCE IMAGING MEDICAL DEVICE

CROSS-REFERENCE TO RELATED APPLICATIONS

The present application is a Continuation of U.S. application Ser. No. 17/307,595, now allowed, having a filing date of May 4, 2021.

STATEMENT OF PRIOR DISCLOSURE BY THE INVENTORS

Aspects of the present disclosure are described in Ashraf Abuelhaija, Gameel Saleh, Tarik Baldawi, Sanaa Salama (12 Apr. 2021), Symmetrical and Asymmetrical Microstripline-based Transmit/Receive Switches for 7 Tesla Magnetic Resonance Imaging, Doi: 10.1002/cta.3013. Further aspects of the present disclosure are described in Gameel Saleh, Ashraf Abuelhaija (21-24 Apr. 2021) Dual Tuned Switch for Dual Resonance 1H/13C MRI Coil, IEMTRONICS2021. Additionally, aspects of the present disclosure are described in Ashraf Abuelhaija and Gameel Saleh (February 2021). A Pi-Shaped Compact Dual Tuned 1H/23Na Microstripline-Based Switch for 7-Tesla MRI, Vol. 11, N. 1 ISSN 2039-5086. DOI: https://doi.org/10.15866/irecap.v11i1.20302. Also, aspects of the present disclosure are described in Ashraf Abuelhaij a, Gameel Saleh, Tank Baldawi, Sanaa Salama (August 2020), Symmetrical and Asymmetrical Microstripline-based Transmit/Receive Switches for 7 Tesla Magnetic Resonance Imaging, Manuscript ID: TBioCAS-220-Aug-0255-Reg. Further, aspects of the present disclosure are described in Ashraf Abuelhaija, Gameel Saleh (October 2020), A Dual 1H/31P Quadrature Microstripline-Based Transmit/Receive Switch for 7 Tesla MRI, ISSN: 2088-8708. These are incorporated herein by reference in their entirety.

BACKGROUND

Field of the Invention

The present disclosure is related to a magnetic resonance imaging apparatus and a transmit/receive switching device and, more particularly, to a magnetic resonance imaging apparatus for magnetic resonance imaging of a subject of investigation.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Magnetic resonance imaging (MRI) scanners are medical devices that use magnetic fields, magnetic field gradients, and radio waves to generate images of anatomical features of a subject. The MRI scanners generate images of soft tissues, potentially uncovering tissue characteristics that indicate diseases. There is a demand in healthcare industry for high-quality MRI scanners that produce images with high resolution, superior contrast, and high signal-to-noise (SNR) ratio. To meet the aforementioned criteria, the MRI scanners require magnets with higher strength, which in turn increase the radio frequency (RF) power required to excite atoms, such as hydrogen atoms, at a corresponding resonant frequency. Higher the strength of the magnet in the MRI scanner, higher the speed of precession of atomic nuclei, leading to an increase in the resonant frequency of an RF coil and the energy required to excite spins. The demand for higher RF power may be met using RF power amplifiers with high output signal levels. However, the RF power amplifiers are typically located in an equipment room several meters away from the MRI scanner. The transfer of power requires long RF transmission line cables to reach the MRI scanner from the equipment rooms to feed the RF coil. Having long cables increases insertion loss and reduces a power delivered to the RF coils. One solution is to reduce the insertion losses due to the transmission line cable is by having a near-magnet power amplifier using non-magnetic components and placing the near-magnet power amplifier behind the MRI scanner within an MRI room. However, such solutions may reduce the insertion losses marginally but also introduces other issues such as space and efficiency issues.

US Patent Publication No. 2004/0266362A1 to Watkins et al. is in the field of a a transmit/receive (T/R) switch operating over a range of frequencies to implement a transmit/receive switch having a low loss path during the transmit mode and the receiver mode, however this T/R switch can just handle one resonant frequency and does not disclose a multi-tuning T/R switch. In addition, reduction of insertion loss of a circuit based on microstripline based hybrid couplers is also not disclosed. US Patent Publication No. 2018/0083591A1 to Mandegaran is in the field of a RF duplexer including quadrature hybrid couplers and RF filters to enhance isolation in hybrid-based RF duplexers and multiplexers, however utilizing RF filters in MRI scanners increases noise in circuitry which is undesirable.

SUMMARY

In an exemplary embodiment, a magnetic resonance imaging apparatus for magnetic resonance imaging of a subject of investigation is described. The magnetic resonance imaging apparatus includes a dual-tuned transmit/receive (T/R) switch. The dual tuned T/R switch includes a top side and a bottom side, each of the top side and the bottom side includes two concentric microstripline based hybrid couplers. Each of the two concentric microstripline based hybrid couplers includes an inner microstripline based hybrid coupler and an outer microstripline based hybrid coupler. The inner microstripline based hybrid coupler forms an inner loop of the two concentric microstripline based hybrid couplers and the outer microstripline based hybrid coupler forms an outer loop around the inner loop. In a transmission mode, for the dual-tuned T/R switch, the inner microstripline based hybrid coupler and the outer microstripline based hybrid coupler at the top side of the dual-tuned T/R switch are activated. In a receiving mode, for the dual-tuned T/R switch, the inner microstripline based hybrid coupler and the outer microstripline based hybrid coupler at the top side and at the bottom side of the dual-tuned T/R switch are activated.

In another exemplary embodiment, a magnetic resonance imaging apparatus for magnetic resonance imaging of a subject of investigation is described. The magnetic resonance imaging apparatus includes a multi-tuned T/R switch. The multi-tuned T/R switch includes two microstripline based hybrid couplers: a top hybrid coupler and a bottom hybrid coupler. A first port associated with the top hybrid coupler is configured to receive pulsed radio frequency signal power as an input signal. A second port associated with the top hybrid coupler connected to a radio frequency coil. A third port associated with the bottom hybrid coupler connected to a radio frequency terminator. A fourth port associated with the bottom hybrid coupler connected to a pre-amplifier. Each of the first port, the second port, the third port, and the fourth port are connected to a corresponding shunt capacitor, each of the shunt capacitors are configured to tune a resonance frequency.

In another exemplary embodiment, a magnetic resonance imaging apparatus for magnetic resonance imaging of a subject of investigation is described. The magnetic resonance imaging apparatus including a simultaneous dual-tuned T/R switch, the simultaneous dual-tuned T/R switch is configured to process a signal with two resonance frequencies from one dual resonant RF coil or two single resonant RF coils, simultaneously without tuning. The simultaneous dual-tuned T/R switch includes a top side and a bottom side, each of the top side and the bottom side includes one microstripline based hybrid coupler. Each of the microstripline based hybrid couplers includes at least one port, and the at least port is connected to a corresponding shunt capacitor configured to tune a resonance frequency. In a transmission mode, for the simultaneous dual-tuned T/R switch, the top microstripline based hybrid coupler of the simultaneous dual-tuned T/R switch is activated. In a receiving mode, for the simultaneous dual-tuned T/R switch: the top microstripline based hybrid coupler and the bottom microstripline based hybrid coupler of the simultaneous dual-tuned T/R switch are activated.

The foregoing general description of the illustrative aspect of the present disclosures and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
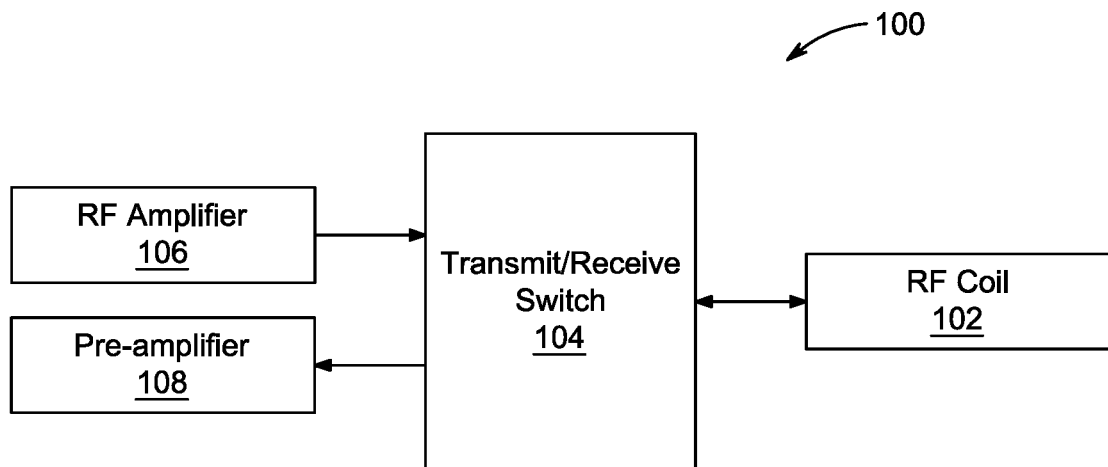
FIG. 1A is a block diagram of a RF system of an MRI apparatus, according to an embodiment of the present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values there between.

Aspects of the present disclosure are directed to an MRI apparatus for magnetic resonance imaging of a subject of investigation.

Referring to FIG. 1A, a block diagram of an RF system 100 of an MRI apparatus, according to one embodiment. FIG. 1A illustrates an RF coil 102 controlled using a T/R switch 104. The RF coil 102 is an electrical component that is located within a magnet assembly of an MRI apparatus (not shown) and designed to be placed relatively close to a subject. The subject may be, for example, a human patient. The RF coil 102 may function as an antenna for transmitting RF signals and receiving signals from the subject. In some embodiments, there may be different RF coil designs for different anatomical regions. Known coil designs include body coils, head coils, and surface coils. Although the RF coil 102 described above performs both transmitting and receiving signals, in some implementations, a separate RF transmitting coil and a separate RF receiving coil may be used for transmitting signals and receiving signals, respectively.

The T/R switch 104 is an electrical component for directing an RF signal power from an RF amplifier 106 to the RF coil 102, and a low power RF signal (also known as nuclear magnetic resonance signal (NMR) signal) from the RF coil 102 to a pre-amplifier 108 (also known as receiver). The T/R switch 104 is designed to protect the pre-amplifier 108 from damages caused by high power RF signal transmission while allowing the RF signal from the RF coil 102 to be passed undistorted and undiminished to the pre-amplifier 108. The T/R switch 104 may include four ports (not shown) connected to various components. The T/R switch 104 is electrically coupled to the RF amplifier 106 at a first port, the RF coil 102 at a second port, and the pre-amplifier 108 at a fourth port. A third port (not shown) is connected to an RF terminator (not shown). In some embodiments, the third port may be terminated internally to the T/R switch 104. The T/R switch 104 may be designed using double sided microstripline based hybrid couplers as described in detail in FIG. 1B and subsequent figures. The RF amplifier 106 (also known as RF power amplifier) is an RF signal generating unit. The pre-amplifier 108 is a circuit configured to process signals received from the RF coil 102.

In operation, during an RF transmission, an RF signal power is provided by the RF amplifier 106. In some embodiments, the RF signal power generated may be in order of several thousand Watts. In some embodiments, the RF signal power required may be determined by a strength of a magnetic field to be applied on the subject. For example, the RF signal power may be proportional to a square of field strength. The generated RF signal power is directed through the T/R switch 104 to the RF coil 102. The RF coil 102 may transmit the RF signal power to the subject. In some implementations, the RF signal power is generated as a series of discrete RF pulses (known as pulsed RF signal power). The subject to which the RF signal is transmitted may respond by emitting an RF signal. The emitted RF signals may be received by the RF coil 102 at the second port and directed to the pre-amplifier 108 through the fourth port. Any additional signals or unwanted reflections are absorbed by the RF terminator at the third port. The RF amplifier 106, the pre-amplifier 108, the T/R switch 104, the RF coil 102 and the RF terminator are part of the MRI apparatus, among other components which are not shown and described herein for the sake of brevity.

Figure 1B:
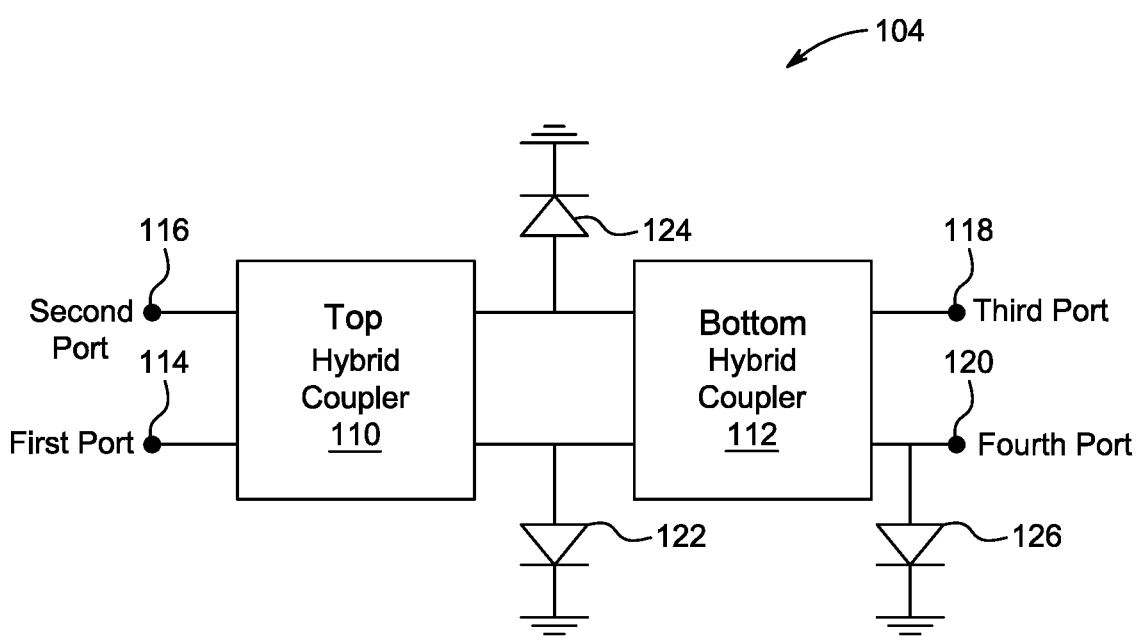
FIG. 1B is a block diagram of a T/R switch using hybrid couplers, according to an embodiment of the present disclosure.

Referring to FIG. 1B, a block diagram of the T/R switch 104 is described, according to an embodiment. The T/R switch 104 is composed of two microstripline based hybrid couplers. The microstripline based hybrid couplers include a top hybrid coupler 110 and a bottom hybrid coupler 112. The top hybrid coupler 110 and the bottom hybrid coupler 112 are connected to a first diode 122 and a second diode 124. As illustrated in FIG. 1B, the T/R switch 104 has four ports. A first port 114 and a second port 116 of the four ports are associated with the top hybrid coupler 110. A third port 118 and a fourth port 120 are associated with the bottom hybrid coupler 112. The first port 114 is coupled to the RF amplifier 106. The second port 116 is connected to the RF coil 102. The third port 118 is connected to an RF terminator (not shown). The fourth port 120 is connected to the pre-amplifier 108 and a third diode 126.

During a transmission mode, the pulsed RF signal power is supplied to the first port 114 as an input signal from the RF amplifier 106. The first diode 122, the second diode 124, and the third diode 126 are forward biased. As a result of the first diode 122, the second diode 124 in forward bias, the supplied RF signal power is reflected to the second port 116. The pre-amplifier 108 is protected from the RF signal power as a result of forward bias of the third diode 126. The RF coil 102 coupled to the second port 116 receives the pulsed RF signal power and transmits the pulsed RF signal power to the subject. During receiving mode, the first diode 122, the second diode 124 and the third diode 126 are reverse biased. An RF signal received at the RF coil 102 from the subject is obtained at the second port 116. From the second port 116, the received RF signal is split between mid-paths and recombined at the fourth port 120. Any unbalanced signals are terminated at the RF terminator at the third port 118. In one example, the T/R switch 104 may be implemented using a folded prototype.

Figure 2A:
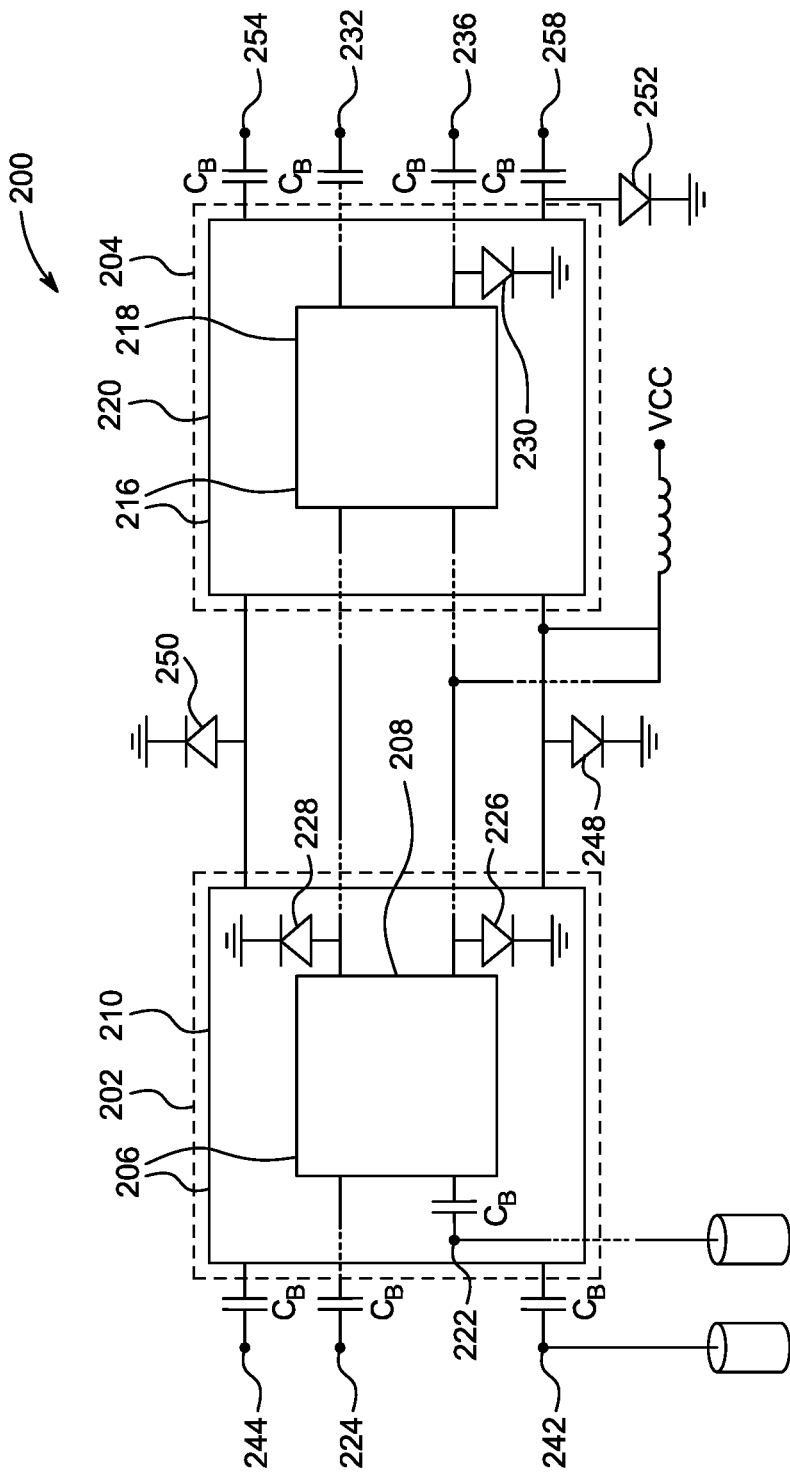
FIG. 2A is a block diagram of a dual-tuned T/R switch having microstripline based hybrid couplers, according to an embodiment of the present disclosure.

FIG. 2A illustrates a block diagram of a dual-tuned T/R switch 200 of an MRI apparatus having microstripline based hybrid couplers, according to one embodiment. The T/R switch 200 is composed of double sided microstripline based couplers, A top side 202 and a bottom side 204. The top side 202 of the T/R switch 200 includes two concentric microstripline based hybrid couplers 206. The two concentric microstripline based hybrid couplers 206 include an inner microstripline based hybrid coupler 208 and an outer microstripline based hybrid coupler 210. The inner microstripline based hybrid coupler 208 forms an inner loop of the two concentric microstripline based hybrid couplers 206. The outer microstripline based hybrid coupler 210 forms an outer loop around the inner loop sharing a common center. The inner microstripline based hybrid coupler 208 includes connections to a first port 222 configured to receive a first pulsed RF signal power as an input signal from an RF amplifier (not shown), and a second port 224 connected to a first RF coil (not shown) to output the first pulsed RF signal power. The inner microstripline based hybrid coupler 208 also includes connections to a first diode 226 and a second diode 228. The outer microstripline based hybrid coupler 210 at the top side 202 includes connections to a fifth port 242 configured to receive a second pulsed RF signal power from another RF amplifier (not shown) as another input signal, and a sixth port 244 connected to a second RF coil to output the second pulsed RF signal power. The outer microstripline based hybrid coupler 210 also includes connections to a fourth diode 248 and a fifth diode 250. In one embodiment, the inner microstripline based hybrid coupler 208 may have the same shape as compared to the outer microstripline based hybrid coupler 210. In some embodiments, the inner microstripline based hybrid coupler 208 may have a different shape as compared to the outer microstripline based hybrid coupler 210.

Similar to the top side 202, the bottom side 204 includes two concentric microstripline based hybrid couplers 216. The two concentric microstripline based hybrid couplers 216 includes an inner microstripline based hybrid coupler 218 and an outer microstripline based hybrid coupler 220. The inner microstripline based hybrid coupler 218 forms an inner loop of the two concentric microstripline based hybrid couplers, and the outer microstripline based hybrid coupler 220 forms an outer loop around the inner loop sharing a common center. The inner microstripline based hybrid coupler 218 is connected to the inner microstripline based hybrid coupler 208 at the first diode 226 and the second diode 228. The inner microstripline based hybrid coupler 218 includes connections to a third diode 230, a third port 232 connected to a first RF terminator (not shown), and a fourth port 236 connected to a first pre-amplifier (not shown). The outer microstripline based hybrid coupler 220 is connected to the outer microstripline based hybrid coupler 210 at the fourth diode 248 and the fifth diode 250. The outer microstripline based hybrid coupler 220 also includes connections to a sixth diode 252, a seventh port 254 connected to a second RF terminator (not shown), and an eighth port 258 connected to a second pre-amplifier (not shown). In one embodiment, the inner microstripline based hybrid coupler 218 may have the same shape in comparison to the outer microstripline based hybrid coupler 220. In some embodiments, the inner microstripline based hybrid coupler 218 may have a different shape in comparison to the outer microstripline based hybrid coupler 220. In some embodiments, the top side 202 and the bottom side 204 of the T/R switch 200 are of equal sizes. In some embodiments, the top side 202 and the bottom side 204 of the T/R switch 200 are of different sizes. Also, in some embodiments, the top side 202 and the bottom side 204 of the T/R switch 200 may be of a same shape. In some embodiments, the top side 202 and the bottom side 204 of the T/R switch 200 may be of different shapes.

The first port 222 is an input port configured to receive the first pulsed RF signal input power. The fifth port 242 is another input port configured to receive a second pulsed RF signal input power. The second port 224 is an output port electrically coupled to the first RF coil, and the sixth port 244 is also an output port electrically coupled to the second RF coil. The fourth port 236 and the eighth port 258 are electrically coupled to the first pre-amplifier and the second pre-amplifier. The first pre-amplifier and the second pre-amplifier are configured to receive a first emitted RF signal and a second emitted RF signal, respectively, from the subject. The third port 232 and the seventh port 254 are coupled to the first RF terminator and the second RF terminator. In an example, the first RF terminator and the second RF terminator may be 50 Ohm RF terminators. A set of DC block capacitors are used at the first port 222, the second port 224, the third port 232, the fourth port 236, the fifth port 242, the sixth port 244, the seventh port 254, and the eighth port 258 to block any stray DC signals. The first diode 226, the second diode 228, the third diode 230, the fourth diode 248, the fifth diode 250, and the sixth diode 252 are, for example, PIN diodes.

Figure 2B:
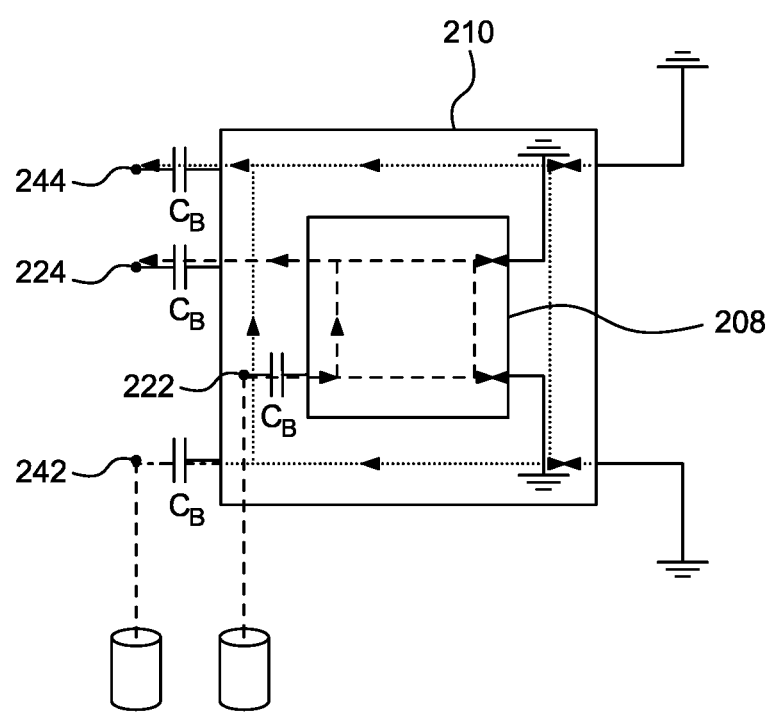
FIG. 2B and FIG. 2C are block diagrams of the dual-tuned T/R switch illustrating a flow of signal during transmit and receive modes, respectively, according to an embodiment of the present disclosure.

The dual-tuned T/R switch 200 is configured to operate in a transmission mode and a receiving mode. In the transmission mode, the inner microstripline based hybrid coupler 208 and the outer microstripline based hybrid coupler 210 at the top side 202 of the T/R switch 200 are activated, while the inner microstripline based hybrid coupler 218 and the outer microstripline based hybrid coupler 220 at the bottom side 204 of the T/R switch 200 are kept inactive. The first pulsed RF signal power is supplied to the first port 222, and the second pulsed RF signal power is supplied to the fifth port 242. The first diode 226 and the second diode 228 are short circuited (for example, by forward biasing) leading to a reflection of the first pulsed RF signal power to the second port 224. From the second port 224, the first pulsed RF signal power is transmitted to the first RF coil. Similarly, the fourth diode 248 and the fifth diode 250 are short circuited (for example, by forward biasing) to reflect the second pulsed RF signal power to the sixth port 244 at which the second RF coil is connected. From the sixth port 244, the second pulsed RF signal power is transmitted to the second RF coil. The first RF coil and the second RF coil transmit the first pulsed RF signal power and the second pulsed RF signal power, respectively, to the subject. To prevent any damages to the fourth port 236 (which is coupled to the first pre-amplifier) from the first pulsed RF signal power, the third diode 230 is configured as short circuit to block the first pulsed RF signal power. Similarly, the eighth port 258 (which is coupled to the second pre-amplifier) is protected from the second pulsed RF signal power by keeping the sixth diode 253 in a short circuit (for example, by forward biasing) to block the second pulsed RF signal power, respectively. The flow of signals in the transmission mode is illustrated in FIG. 2B. FIG. 2B illustrates the first pulsed RF signal power in dashed lines, and the second pulsed RF signal power in dot-dashed lines.

Figure 2C:
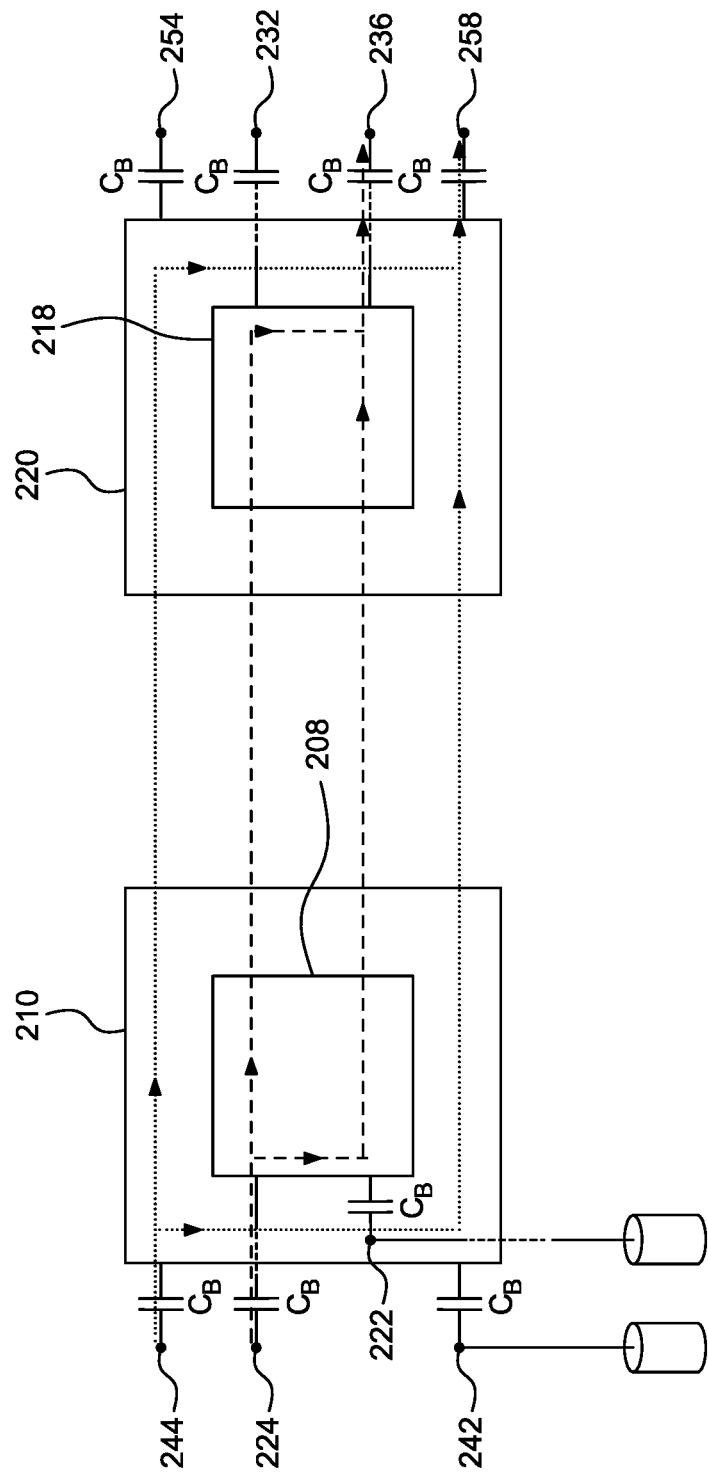

In a receiving mode, the inner microstripline based hybrid coupler 208 and the outer microstripline based hybrid coupler 210 at the top side 202, and the inner microstripline based hybrid coupler 218 and the outer microstripline based hybrid coupler 220 at the bottom side 204 of the T/R switch 200 are activated. The first diode 226, the second diode 228, the third diode 230, the fourth diode 248, the fifth diode 250, and the sixth diode 253 are kept in an open circuit state (for example, reverse biased). The first RF coil receives a first emitted RF signal, and the second RF coil receives a second emitted RF signal from the subject. The first emitted RF signal may be transmitted through the second port 224 to the first pre-amplifier via the fourth port 236. The first emitted RF signal is split in between mid-path as the first diode 226 and the second diode 228 are in an open circuit state. The first emitted RF signal that is split is combined and collected at the fourth port 235 and transmitted to the first pre-amplifier. The second emitted RF signal may be transmitted to the second pre-amplifier from the sixth port via the eighth port 258. The second emitted RF signal may be split in between mid-path due to the fourth diode 248 and the fifth diode 250 placed in an open circuit state. The second emitted RF signal that is split is combined and collected at the eighth port 258 and sent to the second pre-amplifier. Any unbalanced portions of the first emitted RF signal and the second emitted RF signal may be absorbed by the first RF terminator connected at the third port 232 and the second RF terminator connected to the seventh port 254, respectively. FIG. 2C illustrates the flow of signals in the receiving mode with the received first RF signal indicated in dashed lines, and the received second RF signal indicated in dot-dash lines.

Having the double sided microstripline based hybrid couplers 200 in the T/R switch 200 provides capabilities to the MRI apparatus to administer two signals of different frequencies to two different RF coils (that is the first RF coil and the second RF coil), allowing interrogation of two atomic nuclei at a same time. In one or more embodiments, the T/R switch 200 may not have to be configured to have dual tuned switches. As a result, a user may select any set of the dual tuned switches. Some examples of dual tuned switch include $^1H/^{23}Na$, $^1H/^{31}P$, $^1H/^{13}C$ and $^1H/^{19}F$ RF.

Figure 3A:
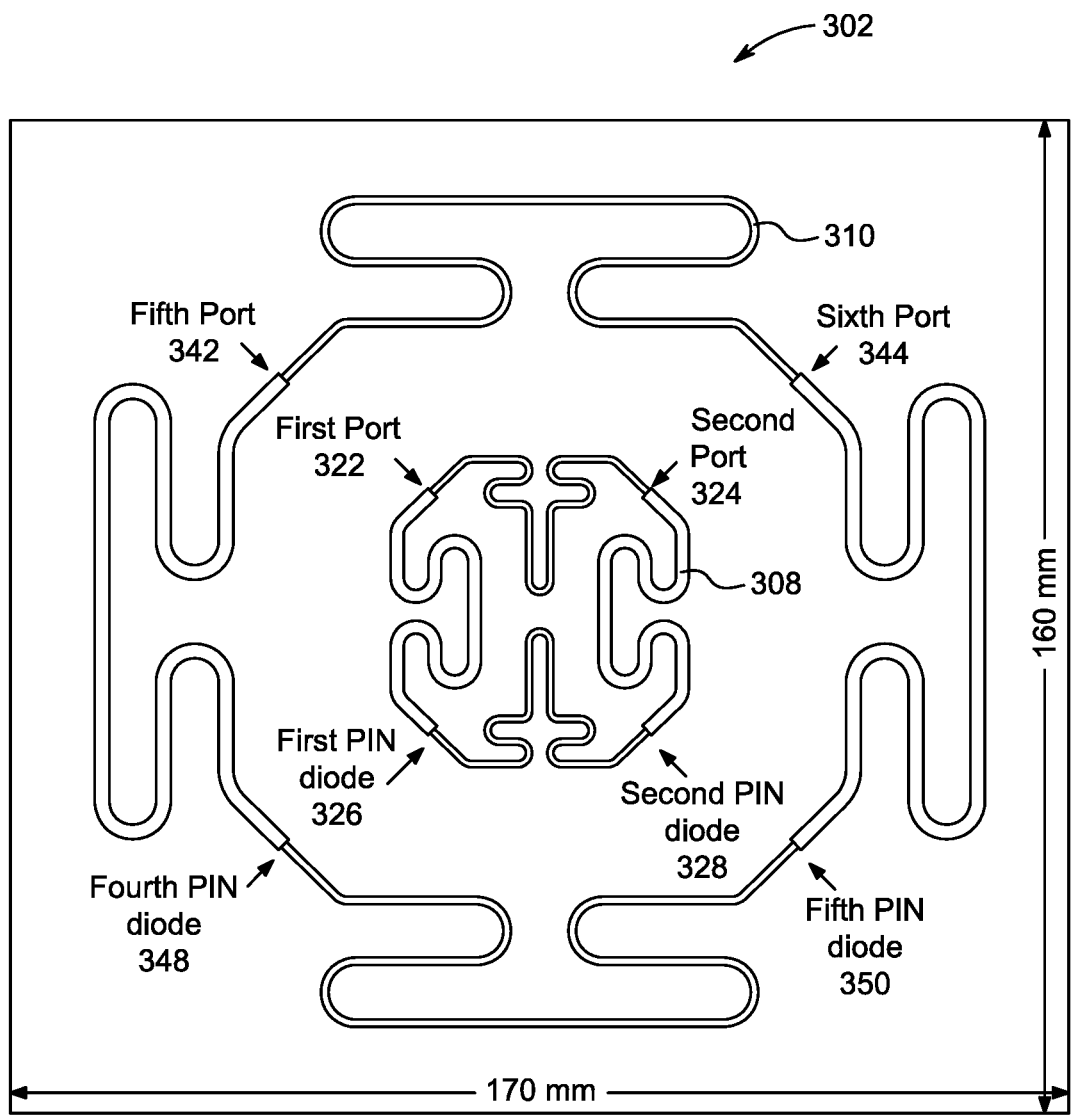
FIG. 3A is a schematic diagram of an example implementation of a dual-tuned T/R switch (1H/31P) using two concentric microstripline based hybrid couplers at a top side, according to an embodiment of the present disclosure.
Figure 3B:
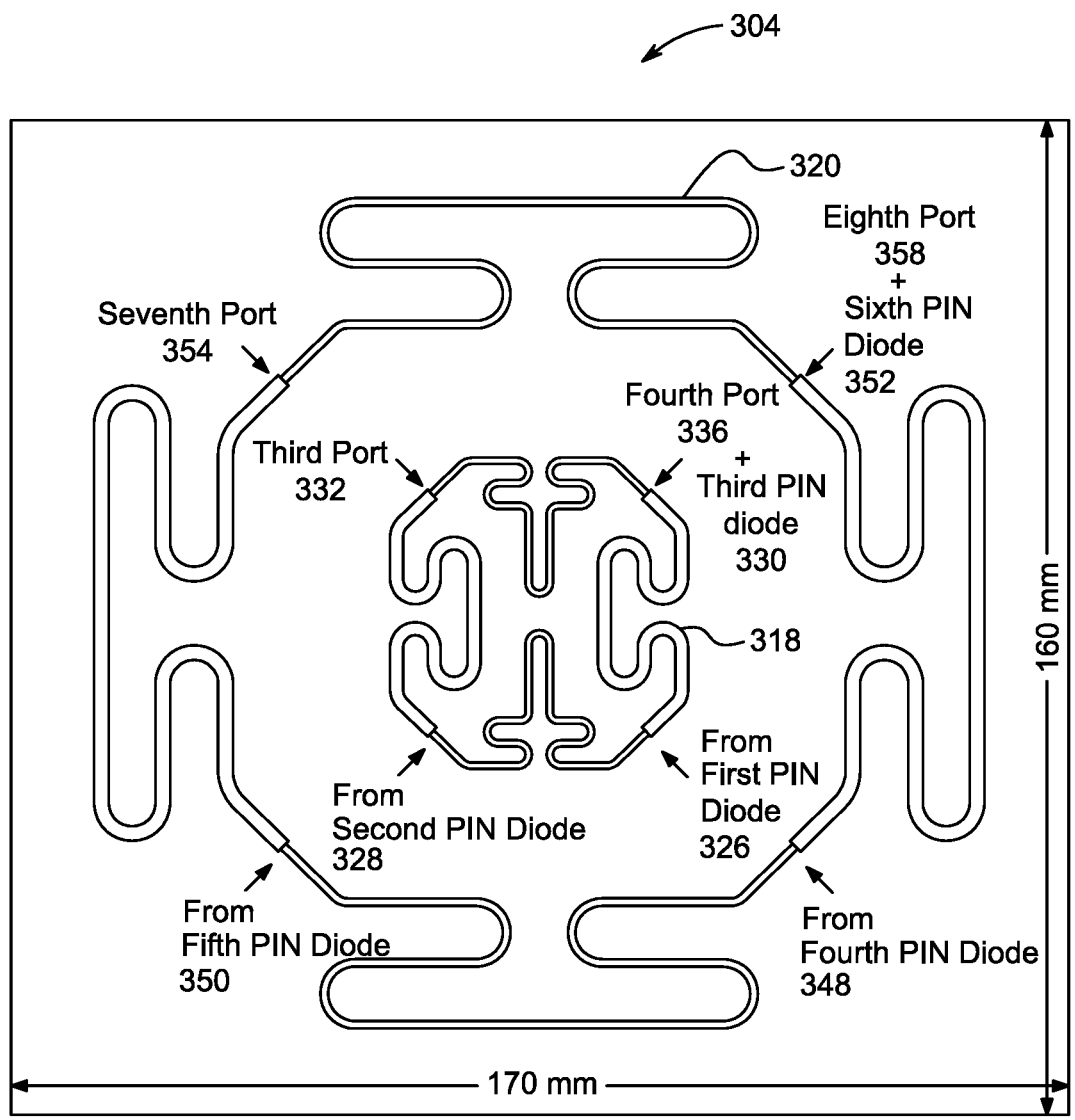
FIG. 3B is a schematic diagram of an example implementation of a dual-tuned T/R switch (1H/31P) using two concentric microstripline based hybrid couplers at a bottom side, according to an embodiment of the present disclosure.

FIG. 3A and FIG. 3B illustrate a schematic circuit diagram of an example implementation of the T/R switch 200 of the block diagram illustrated in FIG. 2A. The T/R switch 200 in this example implementation is with two concentric microstripline based couplers at a top side 302 are shown in FIG. 3A, and two concentric microstripline based couplers at a bottom side 304 are shown in FIG. 3B. The example implementation illustrates a design of the T/R switch 200 based on the microstripline based coupler with two concentric microstriplines to handle signals $^1H/^{31}P$. The T/R switch 200 based on the microstripline based coupler is designed to resonate at two different frequencies namely for 298 MHz at $^1H$ and at 120 MHz for $^{31}P$ at 7 Tesla MRI. The T/R switch 200 as illustrated in FIG. 3A and FIG. 3B are designed using an electromagnetic microwave studio Computer Simulation Technology (CST). The design is achieved by having two concentric microstripline based couplers at a top side 302 as shown in FIG. 3A, and two concentric microstripline based couplers at a bottom side 304 as shown in FIG. 3B. The example microstripline based hybrid coupler switch is designed using a folded shape with a dimension of (170 mm×160 mm×1.27 mm). FIG. 3A illustrates an inner microstripline based hybrid coupler 308 and an outer microstripline based hybrid coupler 310, with the inner microstripline based hybrid coupler 308 forming an inner loop, and the outer microstripline based hybrid coupler 310 forming an outer loop around the inner loop sharing a common center. The inner microstripline based hybrid coupler 308 includes a connection to a first port 322 configured to receive pulsed $^1H$ RF signal power, and the outer microstripline based hybrid coupler 310 includes a connection to a fifth port 342 to receive pulsed $^{31}P$ RF signal power as input, respectively. The inner microstripline based hybrid coupler 308 includes a connection to a second port 324 connected to the $^1H$ RF coil to transmit the pulsed $^1H$ RF signal power, and the outer microstripline based hybrid coupler 310 includes a connection to a sixth port 344 connected to the $^{31}P$ RF coil to transmit the pulsed $^{31}P$ RF signal power to a subject. The inner microstripline based hybrid coupler 308 includes connections to a first PIN diode 326 and a second PIN diode 328, and the outer microstripline based hybrid coupler 310 is illustrated to have connections with a fourth PIN diode 348 and a fifth PIN diode 350.

FIG. 3B illustrates a designed microstripline based couplers with two concentric microstriplines at the bottom side 304. Similar to the top side 302, the bottom side 304 includes two concentric microstripline based hybrid couplers having an inner microstripline based hybrid coupler 318 and an outer microstripline based hybrid coupler 320. The inner microstripline based hybrid coupler 318 forms an inner loop, and the outer microstripline based hybrid coupler 320 forms an outer loop around the inner loop with a common center. The inner microstripline based hybrid coupler 318 at the bottom side 304 includes connections to the first PIN diode 326, the second PIN diode 328, a third port 332 connected to a first RF terminator (of 50 Ohms), and a fourth port 336 connected to a $^1H$ pre-amplifier along with a third PIN diode 330. The outer microstripline based hybrid coupler 320 is illustrated to have connections with the fourth PIN diode 348, the fifth PIN diode 350, a seventh port 354 connected to a second RF terminator, an eighth port 358 connected to $^{31}P$ pre-amplifier, and a sixth PIN diode 352. According to the example implementation, the top side 302 and the bottom side 304 of the double sided microstripline based hybrid couplers are rectangular in shape, with a length of 170 mm and a width of 160 mm. In other example implementations, the top side 302 and the bottom side 304 of the double sided microstripline based hybrid couplers may be designed with different shapes and/or dimensions.

In a transmission mode, the inner microstripline based hybrid coupler 308 and the outer microstripline based hybrid coupler 310 at the top side 302 of the double sided microstripline based hybrid couplers are activated, while the inner microstripline based hybrid coupler 318 and the outer microstripline based hybrid coupler 310 at the bottom side 304 of the double sided microstripline based hybrid couplers are deactivated. The pulsed $^1H$ RF signal power and pulsed $^{31}P$ RF signal power are input into the first port 322 and the fifth port 342, respectively. The first PIN diode 326 and the second PIN diode 328 are short circuited, causing a reflection of the pulsed $^1H$ RF signal power to the second port 324 to which the $^1H$ RF coil is connected. Similarly, the fourth PIN diode 348 and the fifth PIN diode 350 for $^{31}P$ are short circuited, causing a reflection of the pulsed $^{31}P$ signals to the sixth port at which the $^{31}P$ RF coil is connected. As described above, the fourth port 336 and the eighth port 358 are protected from the $^1$H Pulsed RF signal power and the $^{31}$P pulsed RF signal power, by configuring the third PIN diode 330 and sixth PIN diode 353 as short circuits to block the stray pulsed $^1$H RF signal and the pulsed $^{31}$P RF signal, respectively. The flow of signals in the transmission mode is shown in FIG. 2B where the signals flow is shown in dotted and dashed lines.

In a receiving mode, the inner microstripline based hybrid coupler 308 and the outer microstripline based hybrid coupler 310 at the top side 302, and the inner microstripline based hybrid coupler 318 and the outer microstripline based hybrid coupler 320 at the bottom side 304 of the T/R switch are activated. The $^1$H RF coil and $^{31}$P RF coils receive emitted $^1$H RF signal and $^{31}$P RF signal from the subject. The received $^1$H RF signal is split between mid-path due to open circuits caused by the first PIN diode 326, the second PIN diode 328, and the third PIN diode 230. The received $^1$H RF signal power is combined and collected at the fourth port 336. The collected $^1$H RF signal power is provided to the first pre-amplifier. Similarly, the received $^{31}$P RF signal is split between mid-path due to open circuits caused by the fourth PIN diode 348, the fifth PIN diode 350, and the sixth PIN diode 252. The received $^{31}$P RF signal is combined and collected at the sixth port 344. The collected $^{21}$P RF signal is provided to the second pre-amplifier. Any unbalanced and stray signals are absorbed by the 50 Ohms terminators connected at the third port 332 and the seventh port 354, respectively. The flow of signals in the transmission mode and the receiving mode is similar to that as shown in FIG. 2B and FIG. 2C, respectively. The flow of received $^1$H RF signal is shown a dashed lines, and the received $^{31}$P RF signal power is shown as dotted lines in FIG. 2C for the receiving mode. Simulation is performed on the schematic circuits shown in FIG. 3A and FIG. 3B, and resultant EM simulation S-parameters are illustrated in FIG. 4A and FIG. 4B.

Figure 4A:
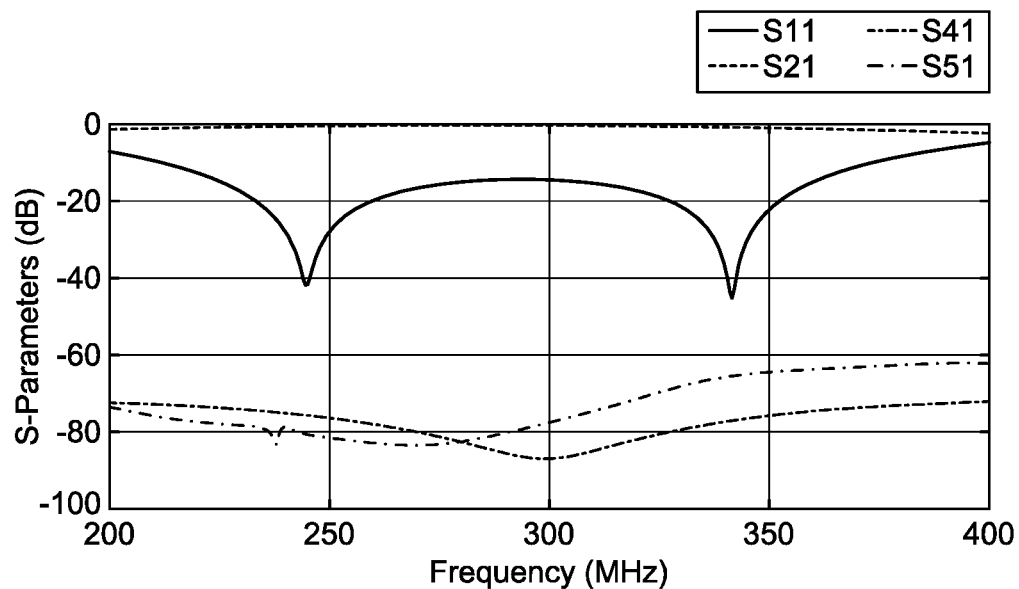
FIG. 4A illustrates electromagnetic (EM) simulation results of S-parameters during a transmission mode of a $^1$H RF signal, according to an embodiment of the present disclosure.
Figure 4B:
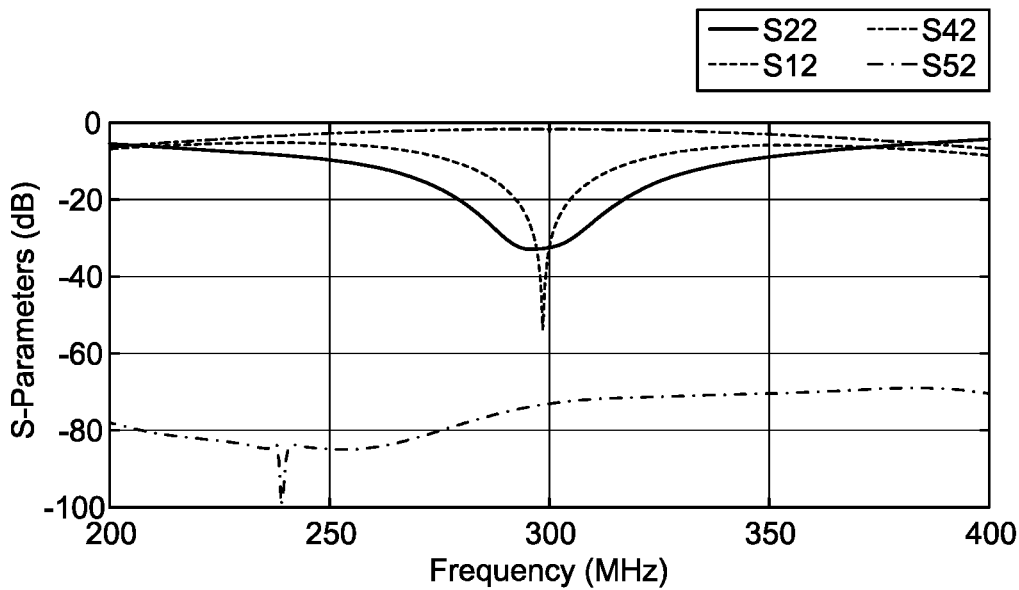
FIG. 4B illustrates EM simulation results of S-parameters during a receiving mode of the $^1$H RF signal, according to an embodiment of the present disclosure.
Figure 4C:
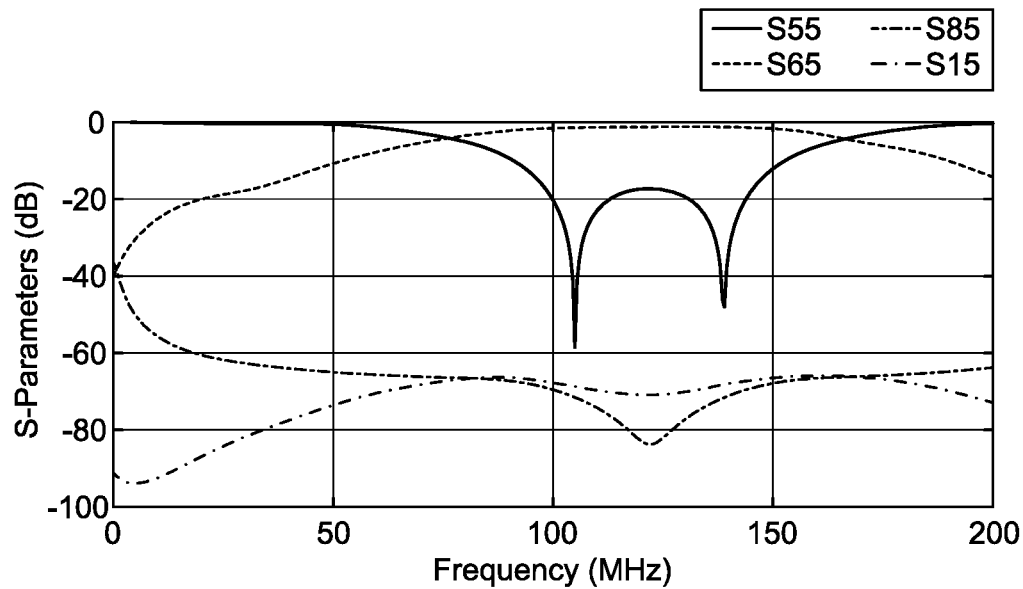
FIG. 4C illustrates EM simulation results of S-parameters during a transmission mode of a $^{31}$P RF signal, according to an embodiment of the present disclosure.

FIG. 4A illustrates electromagnetic (EM) simulation results of S-parameters during the transmission mode of a pulsed $^1$H RF signal power. The EM simulation results of S-parameters with reference to FIGS. 3A and 3B illustrates good matching at the first port 322 (input port) indicated by S11, and a low insertion loss of around 0.3 dB between the first port 322 and the second port 324 (output port at the $^1$H RF coil) indicated by S21. Also, the EM simulation results illustrate a high isolation of about −80 dB between the first port 322 and the fourth port 336 (at the $^1$H pre-amplifier) during the transmission mode as indicated by S41. The isolation between the inner microstripline based hybrid coupler 308 and the outer microstripline based hybrid coupler 310 has been illustrated to have about −75 dB indicated as S51. FIG. 4B illustrates EM simulation results with reference to FIGS. 3A and 3B of S-parameters during the receiving mode of the $^1$H RF signal. The EM simulation illustrates good matching the second port 324 (at the $^1$H RF coil) indicated by S22, and a low insertion loss of around 0.2 dB between the second port 324 (at the $^1$H RF coil) and the fourth port 336 (at $^1$H pre-amplifier) indicated by S42. In addition, high isolation between the second port 324 (at $^1$H RF coil) and the first port 322 of about 40 dB, is illustrated by S12. The isolation between the inner microstripline based hybrid coupler 308 and the inner microstripline based hybrid coupler 318, and the outer microstripline based hybrid coupler 310 and the outer microstripline based hybrid coupler 320, is shown to be more than −70 dB, and shown as S52. FIG. 4C shows the EM simulation S-parameters during the transmission mode of the $^{31}$P Pulsed RF signal power.

Figure 4D:
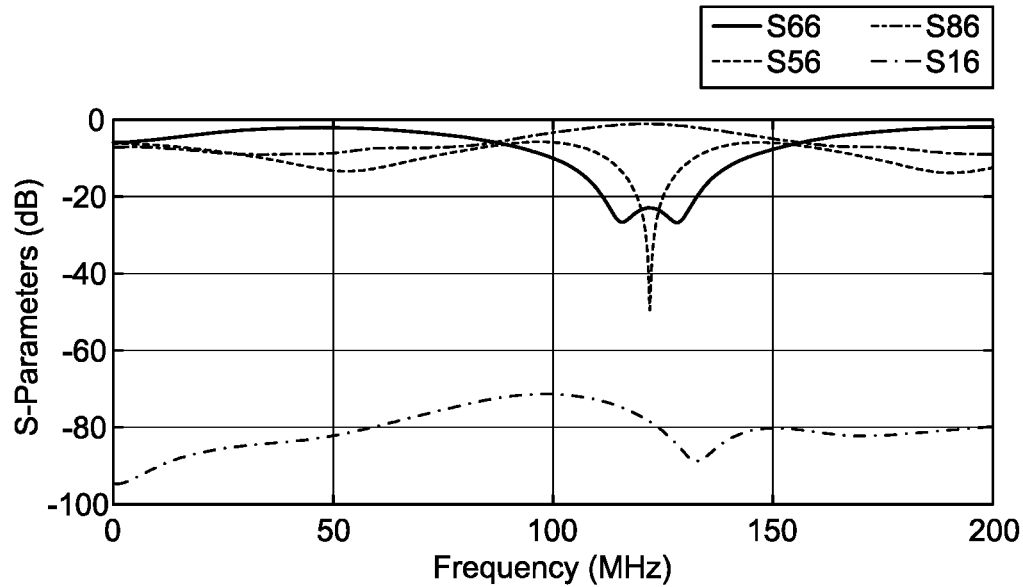
FIG. 4D illustrates EM simulation results of S-parameters during a receiving mode of a $^{31}$P RF signal, according to an embodiment of the present disclosure.

The EM simulation with reference to FIGS. 3A and 3B shows good matching at the fifth port 342 illustrated by S55, and low insertion loss (around 0.3 dB) between the fifth port 342 (at $^{31}$P RF signal power input) and the sixth port 344 (at $^{31}$P RF coil) indicated by S65. High isolation between the fifth port 342 (at $^{31}$P input) and the eighth port 25 of more than −80 dB has been illustrated as S85. The isolation between the inner microstripline based hybrid coupler 308 and the outer microstripline based hybrid coupler 310 has been illustrated to have about −75 dB illustrated as S15. FIG. 4D with reference to FIGS. 3A and 3B illustrates the EM simulation S-parameters during the receiving mode of the $^{31}$P RF signal. Good matching at the sixth port 344 (at $^{31}$P RF coil) is illustrated as S66, and negligible insertion loss (less than 0.2 dB) between the sixth port 344 (at $^{31}$P RF coil) and the eighth port 358 (at $^{31}$P pre-amplifier) is indicated by S86. In addition, high isolation between the sixth port 344 (at $^{31}$P First RF coil) and the fifth port (at $^{31}$P RF input) is illustrated as S56. The isolation between the inner microstripline based hybrid coupler 318 and the outer microstripline based hybrid coupler 320 has been illustrated to have about −75 dB illustrated as S16.

Figure 5A:
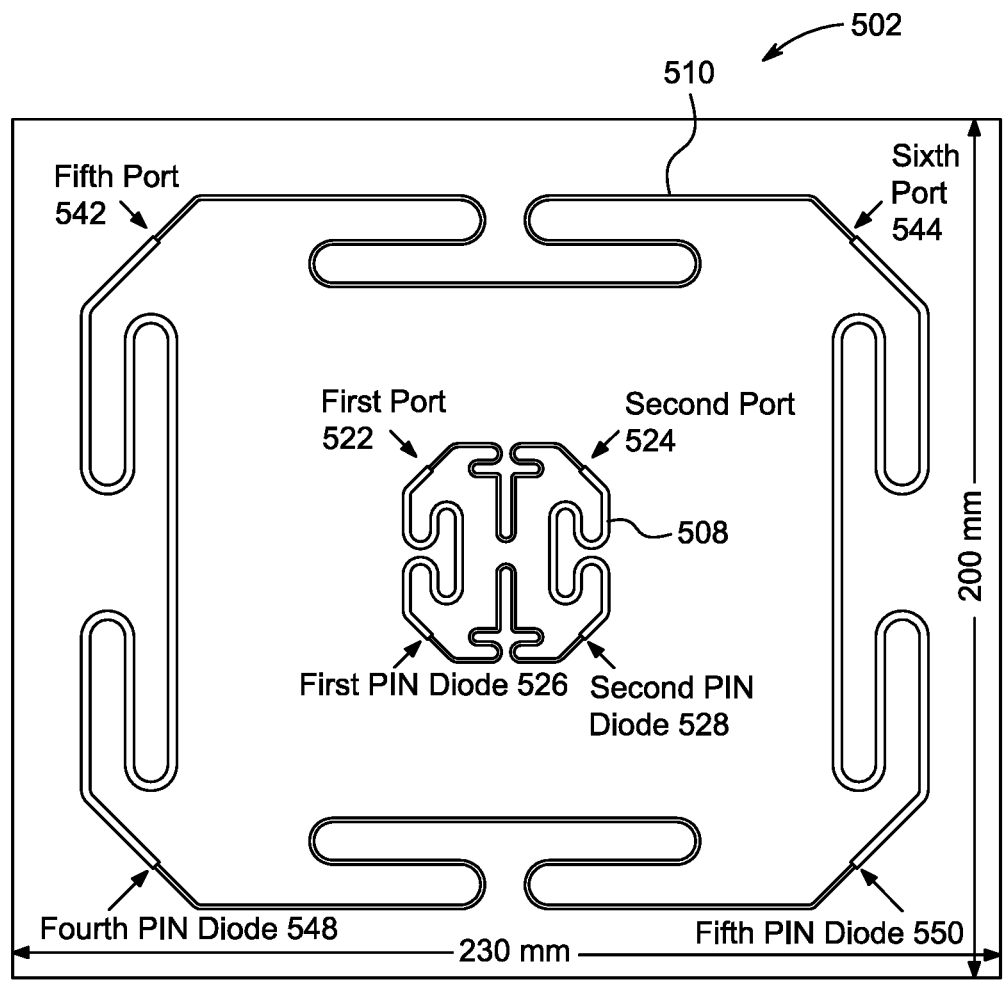
FIG. 5A is a schematic circuit diagram of another example implementation of a dual-tuned T/R switch (1H/23Na) using two concentric microstripline based hybrid couplers at a top side, according to an embodiment of the present disclosure.
Figure 5B:
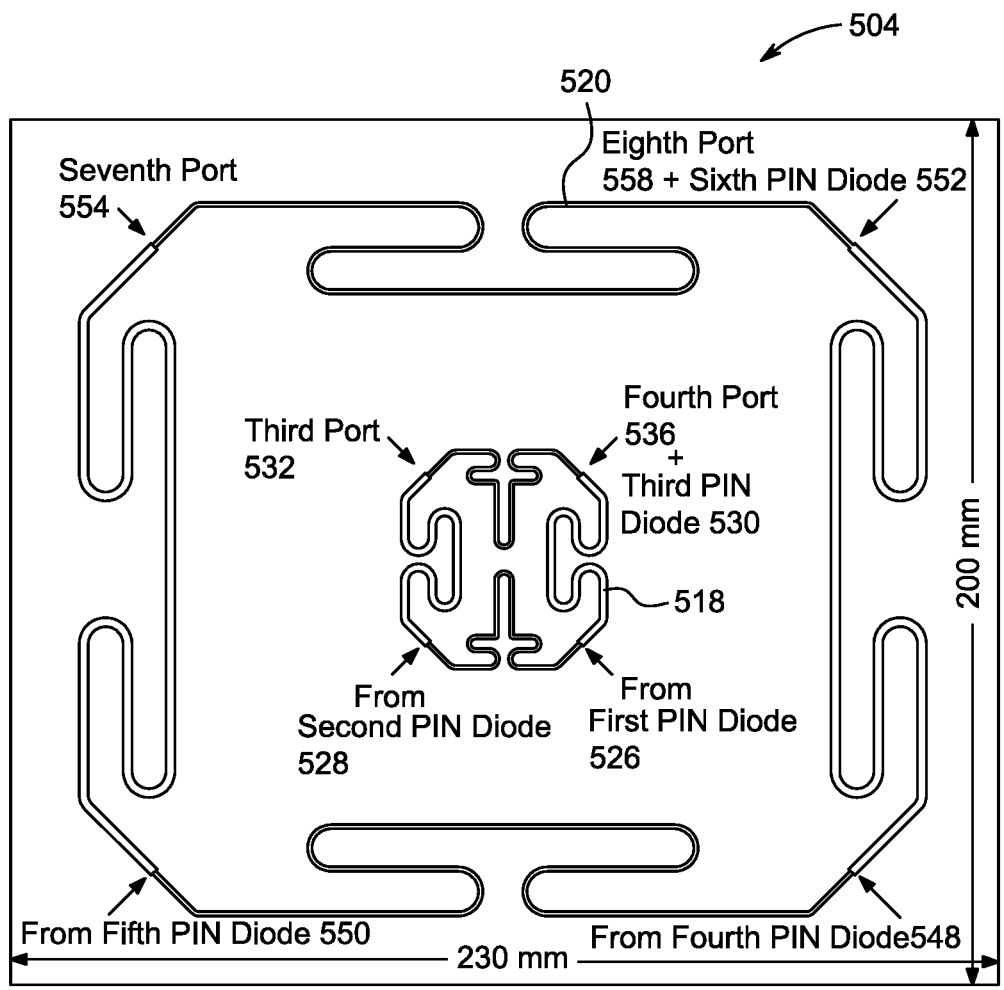
FIG. 5B is a schematic circuit diagram of another example implementation of a dual-tuned T/R switch (1H/23Na) using two concentric microstripline based hybrid couplers at a bottom side, according to an embodiment of the present disclosure.

FIG. 5A and FIG. 5B illustrates an example implementation of a schematic circuit diagram of the T/R switch 200 of FIGS. 2A-2C, according to one embodiment. The double-sided microstripline based hybrid couplers are another example implementation of T/R switch 200 of FIGS. 2A-2C. FIG. 5A and FIG. 5B illustrates 502 and 504 as example implementation of the T/R switch 200 designed using folded microstripline to handle the signals from/to $^1$H/$^{23}$Na magnetic resonance coils at 7 Tesla. This example implementation of T/R switch 200 of FIGS. 5A-5B is designed in correspondence with the design of microstripline based couplers with two concentric microstriplines illustrated in FIGS. 3A-3B. In this embodiment, an inner coupler (that includes an inner microstripline based hybrid coupler 508 and an inner microstripline based hybrid coupler 518) is designed at a resonance frequency 298 MHz for Hydrogen ($^1$H) atoms. An outer coupler (including an outer microstripline based hybrid coupler 510 and an outer microstripline based hybrid coupler 520) is designed at a resonance frequency 78.8 MHz for Sodium ($^{23}$Na) atoms. The T/R switch 200 for the above resonant frequencies, with the design corresponding to the double-sided microstripline based hybrid couplers of FIGS. 3A-B, is illustrated with dimensions of 230 mm×200 mm in FIGS. 5A and 5B. The design and functioning of the T/R switch 200 illustrated in FIG. 5A and FIG. 5B are substantially similar to that of the T/R switch illustrated in FIG. 3A and FIG. 3B. The T/R switch 200 includes a top side 502 as shown in FIG. 5A, and a bottom side 504 as shown in FIG. 5B.

FIG. 5A illustrates an inner microstripline based hybrid coupler 508 and an outer microstripline based hybrid coupler 510, with the inner microstripline based hybrid coupler 508 forming an inner loop, and the outer microstripline based hybrid coupler 510 forming an outer loop around the inner loop sharing a common center. The inner microstripline based hybrid coupler 508 includes connection to a first port 522 configured to receive pulsed $^1$H RF signal power, and the outer microstripline based hybrid coupler 562 includes connection to a fifth port 542 configured to receive pulsed $^{23}$Na RF signal power as input signals. A second port 524 is connected to the $^1$H RF coil to transmit the pulsed $^1$H RF signal power, and the sixth port 544 is connected to the $^{23}$Na RF coil to transmit the pulsed $^{23}$Na RF signal power to a subject. The inner microstripline based hybrid coupler 508 includes connections to a first PIN diode 526 and a second PIN diode 528, and the outer microstripline based hybrid coupler 510 is illustrated to have connections with a fourth PIN diode 548 and a fifth PIN diode 550. FIG. 5B illustrates a designed microstripline based couplers with two concentric microstriplines at the bottom side 504. Similar to the top side 502, the bottom side 504 includes two concentric microstripline based hybrid couplers having an inner microstripline based hybrid coupler 518 and an outer microstripline based hybrid coupler 520. The inner microstripline based hybrid coupler 518 forms an inner loop, and the outer microstripline based hybrid coupler 520 forms an outer loop around the inner loop with a common center. The inner microstripline based hybrid coupler 518 at the bottom side 504 includes connections to the first PIN diode 526, the second PIN diode 528, a third port 532 connected to a first RF terminator (of 50 Ohms), and a fourth port 536 connected to a $^1$H pre-amplifier along with a third PIN diode 530. The outer microstripline based hybrid coupler 520 is illustrated to have connections with the fourth PIN diode 548, the fifth PIN diode 550, a seventh port 554 connected to a second RF terminator, and an eighth port 558 connected to $^{23}$Na pre-amplifier and a sixth PIN diode 552. According to the example implementation, the top side 502 and the bottom side 504 of the double sided microstripline based hybrid couplers are rectangular in shape.

Operation of this dual-tuned T/R switch 200 of FIGS. 5A and 5B based on double sided microstripline based hybrid couplers is substantially similar as described in FIG. 3A and FIG. 3B. During a transmission mode, the inner microstripline based hybrid coupler 508 and the outer microstripline based hybrid coupler 510 are activated, and the inner microstripline based hybrid coupler 518 and the outer microstripline based hybrid coupler 520 are inactivated. The $^1$H pulsed RF signal power is supplied to a first port 522 and transmitted to a first RF coil ($^1$H RF coil) through a second port 524. At the same time, $^{23}$NA pulsed RF signal power is supplied to a fifth port 542 and transmitted to a second RF coil ($^{23}$NA RF coil) through a sixth port 544. During a receiving mode, the inner microstripline based hybrid coupler 508, the outer microstripline based hybrid coupler 510, the inner microstripline based hybrid coupler 518, and the outer microstripline based hybrid coupler 520 are activated. The $^1$H RF signal emitted by a subject is obtained by the first RF coil and is transmitted to a fourth port 536 through the second port 524, while $^{23}$NA RF signal emitted by the subject is obtained by the second RF coil at the sixth port 544 and is transmitted to an eighth port 558. Any unbalanced $^{23}$NA RF signal power or $^1$H RF signal power in the transmission mode or the receiving mode, are absorbed by an RF terminator connected to a third port 532 and an RF terminator connected to a seventh port 554. In this example, the T/R switch 200 is described in FIG. 5A and FIG. 5B, the the T/R switch 200 is designed on a RO3010 Rogers substrate with εr=10.2 and tan δ=0.0022. Simulation is performed on the schematic circuits shown in FIG. 5A and FIG. 5B, and resultant EM simulation S-parameters are illustrated in FIG. 6A and FIG. 6B.

Figure 6A:
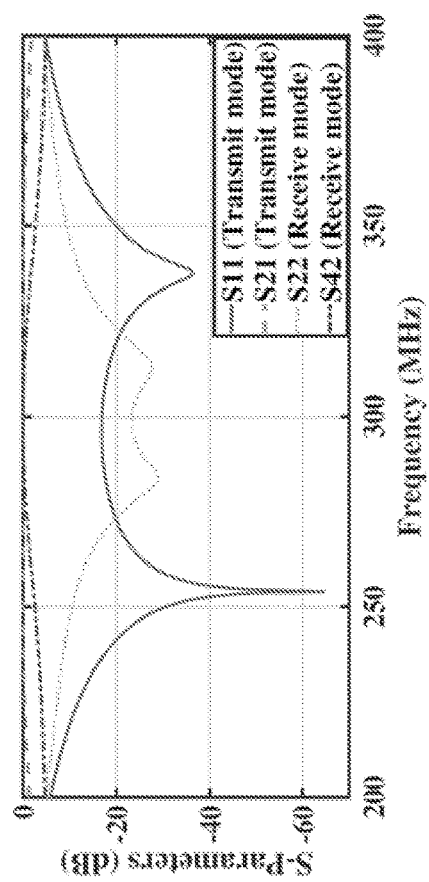
FIG. 6A illustrates EM simulation results of S-parameters for T/R switch of FIG. 5A and FIG. 5B for 1H MRI at 298 MHz, according to an embodiment of the present disclosure.
Figure 6B:
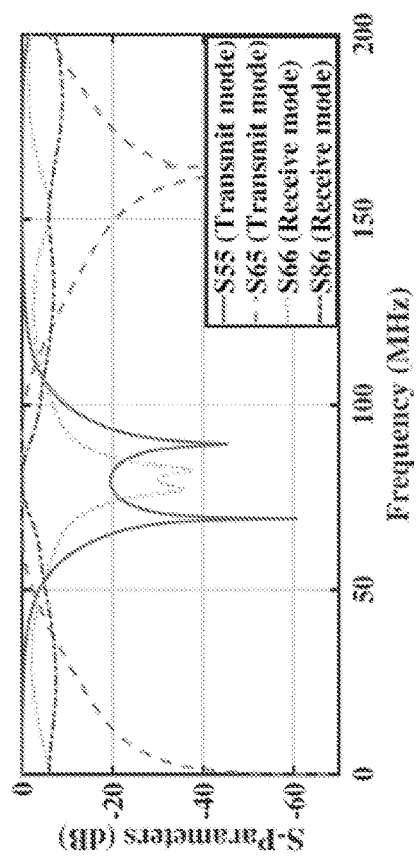
FIG. 6B illustrates EM simulation results of S-parameters for T/R switch of FIG. 5A and FIG. 5B for 23Na MRI at 78.8 MHz, according to an embodiment of the present disclosure.

FIG. 6A and FIG. 6B shows the EM simulation results of S-parameters for T/R switch 200 as implemented in FIG. 5A and FIG. 5B, respectively. FIG. 6A illustrates the S-parameters for $^1$H coupler during the transmission mode and the receiving mode. The S-parameter illustrates good matching with a negligible insertion loss of about 0.1 dB indicated by S21 during the transmission mode, and a low insertion loss of about 0.1 dB indicated by S42 during the receiving mode. The S-parameters S11 and S22 indicate good matching at the first port 522 and the second port 524, at the transmission mode and the receiving mode, respectively. FIG. 6B illustrates S-parameters for the outer coupler ($^{23}$Na coupler) during the transmission mode and the receiving mode. The S-parameter illustrates good matching of low insertion loss of about 0.05 dB indicated by S65 during the transmission mode, and low insertion loss of about 0.05 dB indicated by S86 during the receiving mode. The S-parameters S55 and S66 indicate good matching at the fifth port 542 and the sixth port 544, at the transmission mode and the receiving mode, respectively. In addition, the EM simulation demonstrates more than 75 dB isolation (S51) between the inner coupler and the outer coupler (not shown).

Figure 7A:
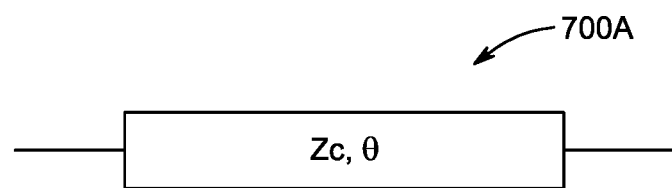
FIG. 7A illustrates a transmission line, according to an embodiment of the present disclosure.
Figure 7B:
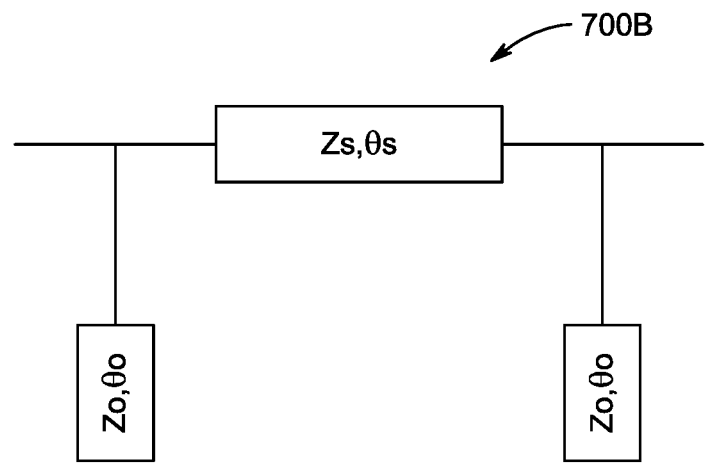
FIG. 7B illustrates a pi-shaped equivalent transmission line, according to an embodiment of the present disclosure.

As seen in FIG. 5A and FIG. 5B, some unused space between the outer coupler and the inner coupler may be identified. The unused space may be reduced by designing the outer coupler closer to the inner coupler, sharing a common center. In one embodiment, a transmission line theory based miniaturization technique to reduce the unused space may be used. A conventional transmission line 700A is represented by FIG. 7A, and a transmission line 700B represented by a pi-shaped equivalent circuit is illustrated in FIG. 7B. The pi-shaped equivalent includes one series transmission line and two open stubs. Equivalent circuit parameters may be expressed by:

$$Z_s = \frac{Zc\sin\theta}{\sin\theta s}; \tag{1}$$

$$\frac{\tan\theta o}{Zo} = \frac{\cos\theta s - \cos\theta}{Zc\sin\theta}; \tag{2}$$

where Zc and θ are the characteristic impedance and electrical length of the conventional transmission line, respectively. Zs and θs are the characteristic impedance and electrical length of the series transmission line in the pi-equivalent circuit, respectively. Zo and θo are the characteristic impedance and the electrical length of the two open stubs. Electrical length of series transmission line θs may be chosen to be 45°. Equations (1) and (2) may be computed twice. In one embodiment, the equation (1) and the equation (2) may be computed initially for the hybrid coupler branch with conventional transmission line parameters Zc=50Ω and θ=90°. The equation (1) and the equation (2) may be computed subsequently for the hybrid coupler branch with the conventional transmission line parameters Zc=50/√2Ω and θ=90°. The results have been summarized in Table 1, where w and l are the width and length of the corresponding microstripline, respectively.

TABLE 1

| | 78.8 MHZ COUPLER WITH $\theta_S = 45$ | |
|---|---|---|
| | Zc = 50 Ω, θ = 90° | Zc = 35.35 Ω, θ = 90° |
| Zs θs | 70.71Ω  ω = 0.45 mm<br>45▫    l = 180 mm | 50Ω  ω = 1.07 mm<br>45▫  l = 175.5 mm |
| Zo θo | 70.71Ω  ω = 0.45 mm<br>45▫    l = 180 mm | 50Ω  ω = 1.07 mm<br>45▫  l = 175.5 mm |

Figure 5C:
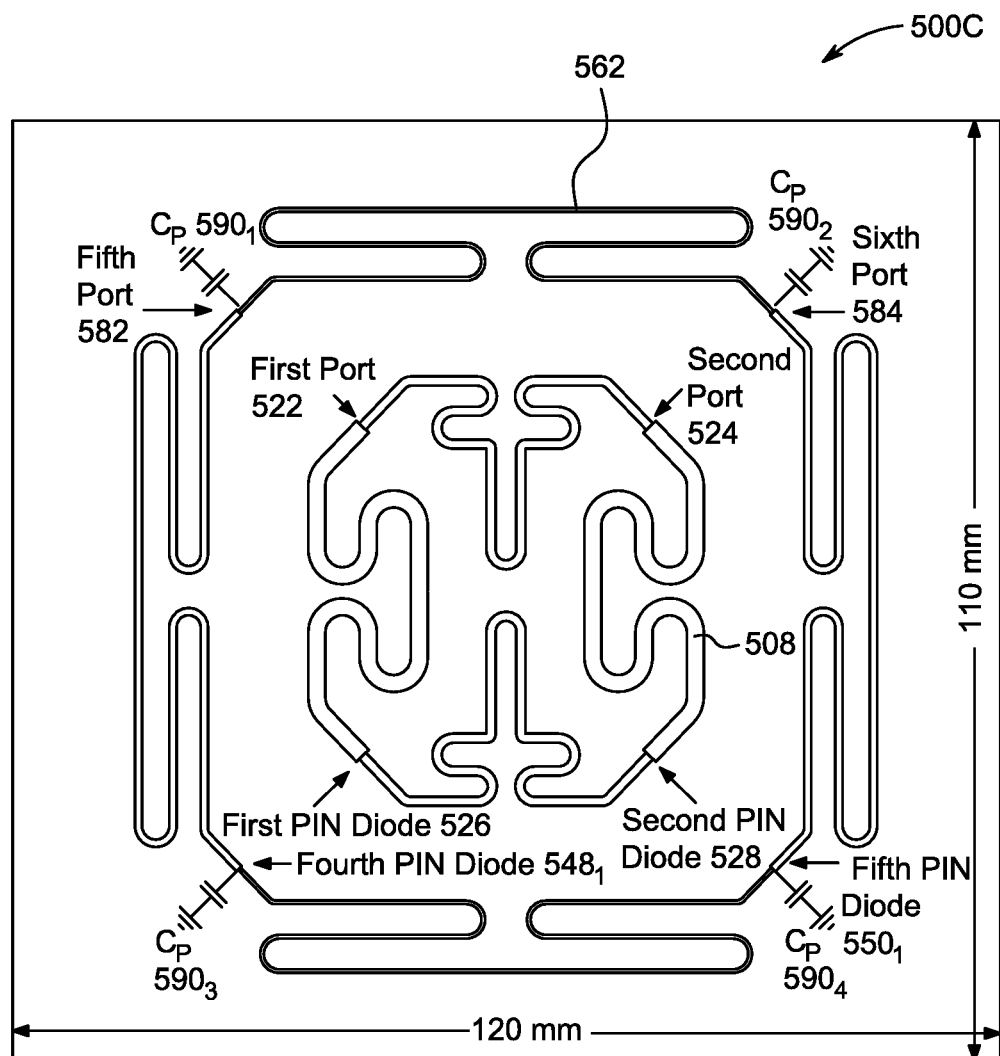
FIG. 5C is a schematic circuit diagram of an example implementation of a dual-tuned T/R switch (1H/23Na) using two concentric microstripline based hybrid couplers with a compact outer coupler at a top side, according to an embodiment of the present disclosure.
Figure 5D:
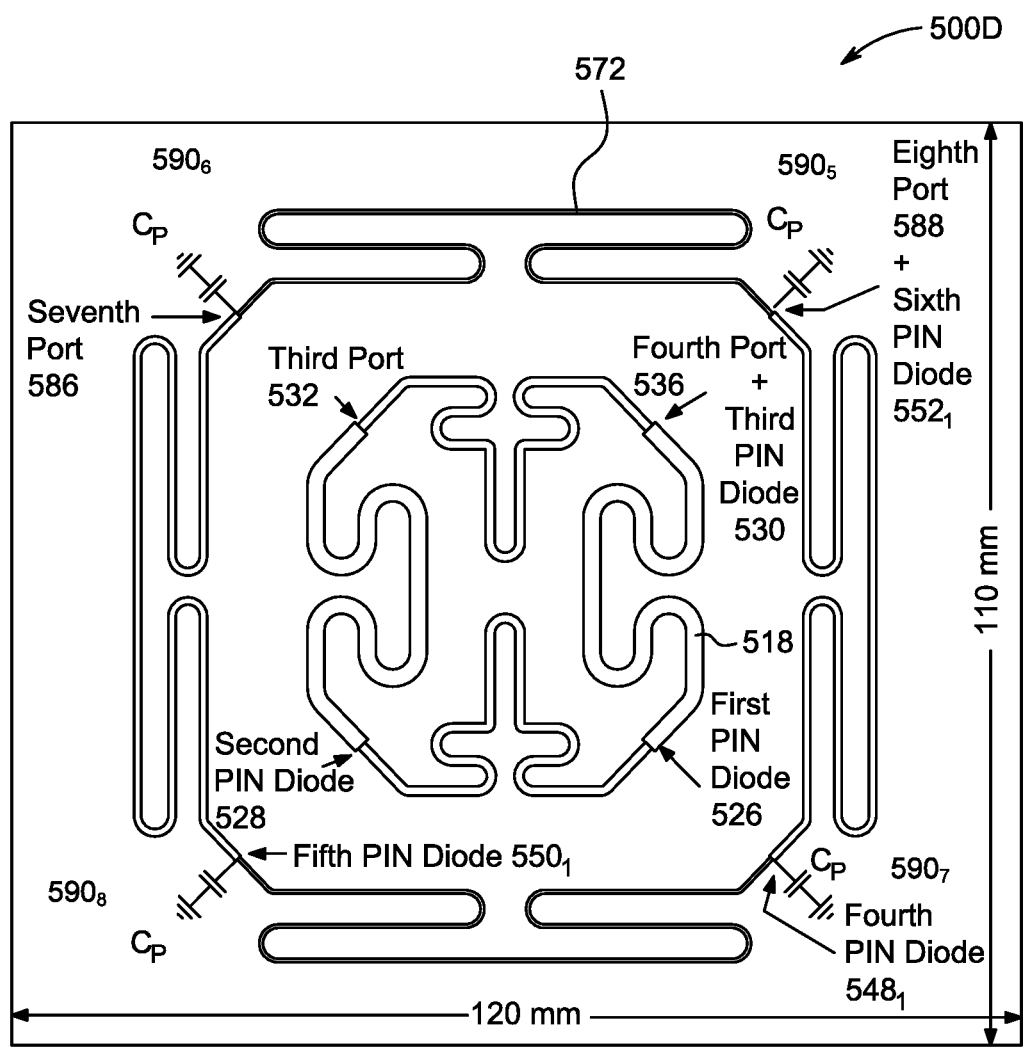
FIG. 5D is a schematic circuit diagram of an example implementation of a dual-tuned T/R switch (1H/23Na) using two concentric microstripline based hybrid couplers with a compact outer coupler at a bottom side, according to an embodiment of the present disclosure.

A resultant of compact design of the T/R switch 200 is illustrated as an example implementation in FIG. 5C and FIG. 5D. The top side 500C of the T/R switch 200 illustrates a compact design of a $^{23}$Na hybrid coupler (outer coupler) with the $^1$H inner coupler design unchanged. In the example, the inner microstripline based hybrid coupler 508 and the inner microstripline based hybrid coupler 518 have been designed at a resonance frequency of 298 MHz for Hydrogen ($^1$H) atoms. The compact outer microstripline based hybrid coupler 562 and the compact outer microstripline based hybrid coupler 572 have been designed at a resonance frequency of 78.8 MHz for Sodium ($^{23}$Na) atoms.

FIG. 5C illustrates a top side 500C having an inner microstripline based hybrid coupler 508 and an outer microstripline based hybrid coupler 562, with the inner microstripline based hybrid coupler 508 forming an inner loop, and the outer microstripline based hybrid coupler 562 forming an outer loop around the inner loop sharing a common center. The inner microstripline based hybrid coupler 508 includes connection to a first port 522 configured to receive pulsed $^1$H RF signal power, and the outer microstripline based hybrid coupler 562 includes connection to a fifth port 582 configured to receive pulsed $^{23}$Na RF signal power as input signals. A second port 524 is connected to the $^4$H RF coil to transmit the pulsed $^4$I RF signal power, and the sixth port 584 is connected to the $^{23}$Na RF coil to transmit the pulsed $^{23}$Na RF signal power to a subject. The inner microstripline based hybrid coupler 508 includes connections to a first PIN diode 526 and a second PIN diode 528, and the outer microstripline based hybrid coupler 562 is illustrated to have connections with a fourth PIN diode 548$_1$ and a fifth PIN diode 550$_1$. FIG. 5D illustrates a designed microstripline based coupler with two concentric microstriplines at the bottom side 500D. Similar to the top side 500C, the bottom side 500D includes two concentric microstripline based hybrid couplers having an inner microstripline based hybrid coupler 518 and an outer microstripline based hybrid coupler 572. The inner microstripline based hybrid coupler 518 forms an inner loop, and the outer microstripline based hybrid coupler 572 forms an outer loop around the inner loop with a common center. The inner microstripline based hybrid coupler 518 at the bottom side 504 includes connections to the first PIN diode 526, the second PIN diode 528, a third port 532 connected to a first RF terminator (of 50 Ohms), and a fourth port 536 connected to a $^1$H preamplifier along with a third PIN diode 530. The outer microstripline based hybrid coupler 572 is illustrated to have connections with the fourth PIN diode 548$_1$, the fifth PIN diode 550$_1$, a seventh port 586 connected to a second RF terminator, and an eighth port 588 connected to $^{23}$Na preamplifier and a sixth PIN diode 352$_1$. According to the example implementation, the top side 500C and the bottom side 500D of the double sided microstripline based hybrid couplers are rectangular in shape.

In one or more embodiments, each adjacent open stubs in the T/R switch 200 of FIGS. 5C and 5D is replaced with a shunt capacitor Cp with a value of 69 pF, enabling the reduction in size of the outer microstripline based hybrid couplers 562-572. For example, the stubs at the fifth port 582, the sixth port 584, a fourth PIN diode 548$_1$, a fifth PIN diode 550$_1$, the eighth port 588, the seventh port 586, a fourth PIN diode 548$_1$ (bottom side) and a fifth PIN diode 550$_1$ (bottom side) are connected with the shunt capacitors Cp 590$_1$, Cp 590$_2$, Cp 590$_3$, Cp 590$_4$, Cp 590$_5$, Cp 590$_6$, Cp 590$_7$, and Cp 590$_8$ respectively. The size of this example implementation of the T/R switch 200 illustrated in 500C-500D (120 mm×100 mm) has been reduced close to half as compared to the size of the double sided microstripline based hybrid couplers 502-504 (230 mm×200 mm). Functioning of the T/R switch 200 of FIGS. 5C and 5D is substantially similar to that of the T/R switch 200 implementation in in FIGS. 5A and 5B, respectively.

Figure 6C:
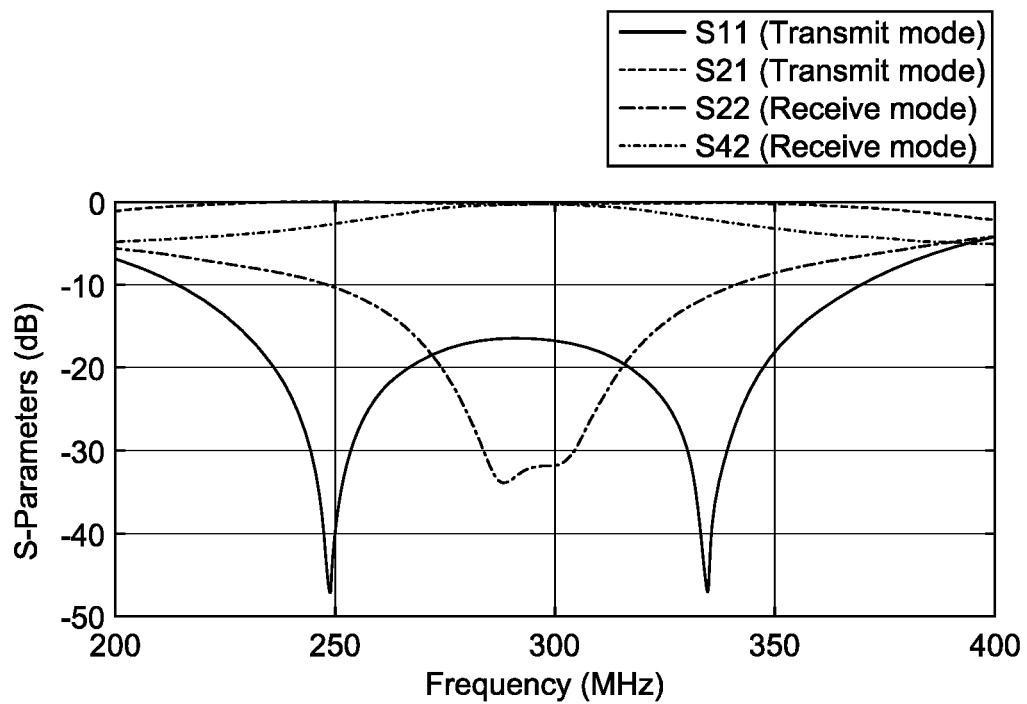
FIG. 6C illustrates EM simulation results of S-parameters for T/R switch of FIG. 5C and FIG. 5D for 1H MRI at 298 MHz, according to an embodiment of the present disclosure.
Figure 6D:
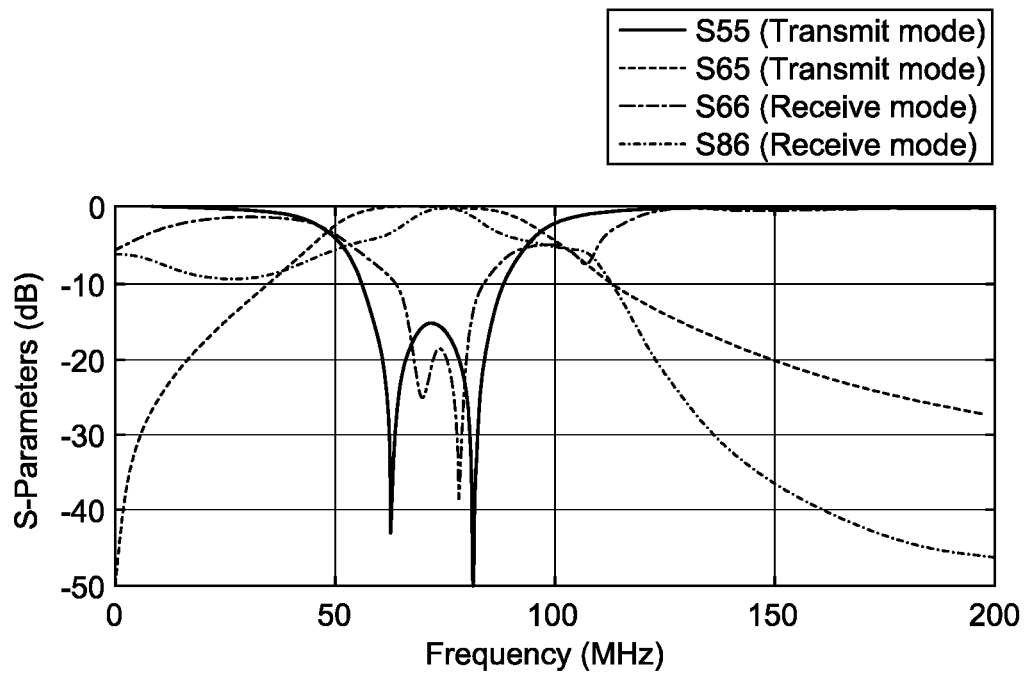
FIG. 6D illustrates EM simulation results of S-parameters for T/R switch of FIG. 5C and FIG. 5D for 23Na MRI at 78.8 MHz, according to an embodiment of the present disclosure.

FIG. 6C and FIG. 6D shows the EM simulation results of S-parameters for the T/R switch of FIG. 5C and FIG. 5D, with a compact outer coupler ($^{23}$Na coupler). FIG. 6C illustrates S-parameters for the inner coupler ($^1$H coupler) of the T/R switch during the transmit mode and the receive mode. The S-parameter illustrates good matching with a low insertion loss of about 0.12 dB indicated by S21 during the transmission mode, and good matching with a low insertion loss of about 0.14 dB indicated by S42 during the receive mode. FIG. 6D illustrates S-parameters for the compact outer coupler during the transmission mode and the receiving mode. The S-parameter illustrates good matching with a low insertion loss of about 0.033 dB as indicated by S65 during the transmission mode, and good matching with a low insertion loss of about 0.33 dB as indicated by S86 during the receiving mode. Also, more than 60 dB isolation is achieved as indicated by S51 between the inner coupler and outer couplers (not shown).

Figure 5E:
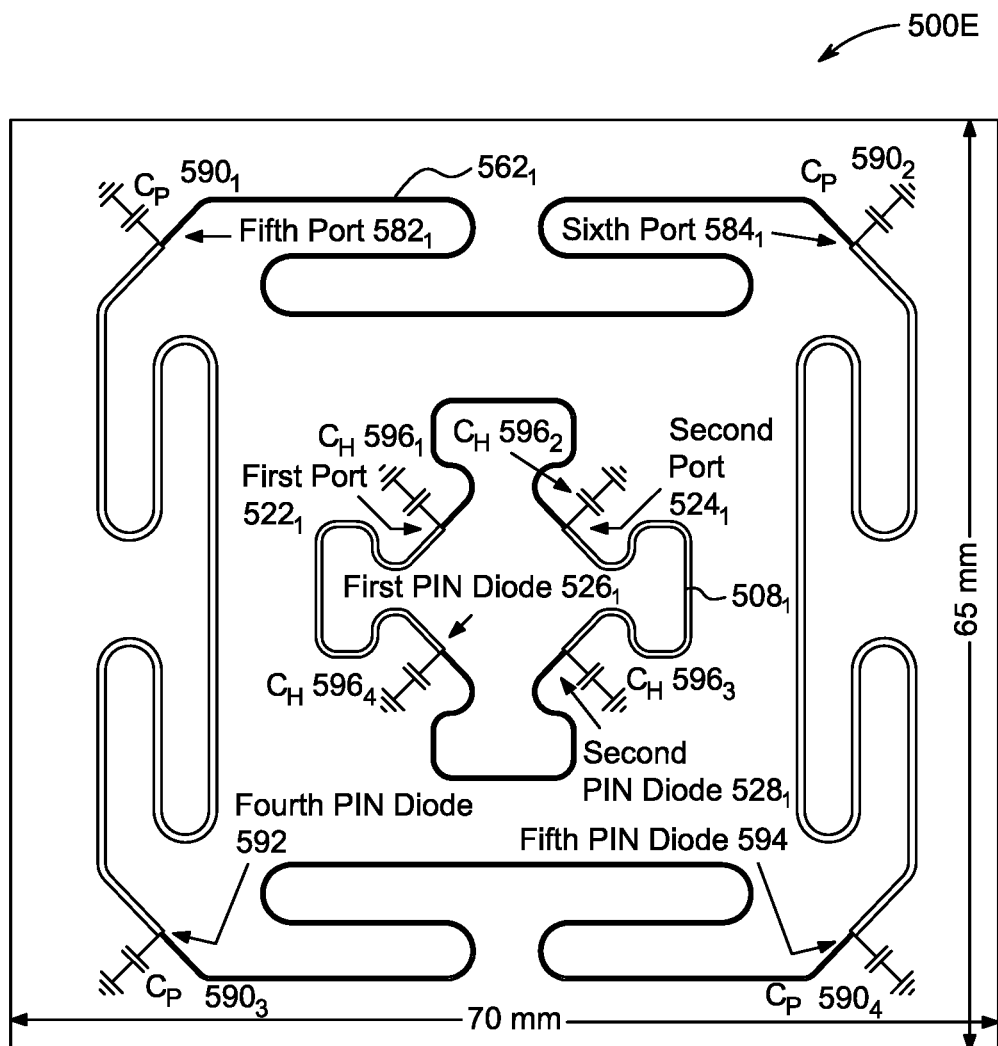
FIG. 5E is a schematic circuit diagram of an example implementation of a dual-tuned T/R switch (1H/23Na) using two concentric microstripline based hybrid couplers using a pi-equivalent circuit for both couplers at a top side, according to an embodiment of the present disclosure.
Figure 5F:
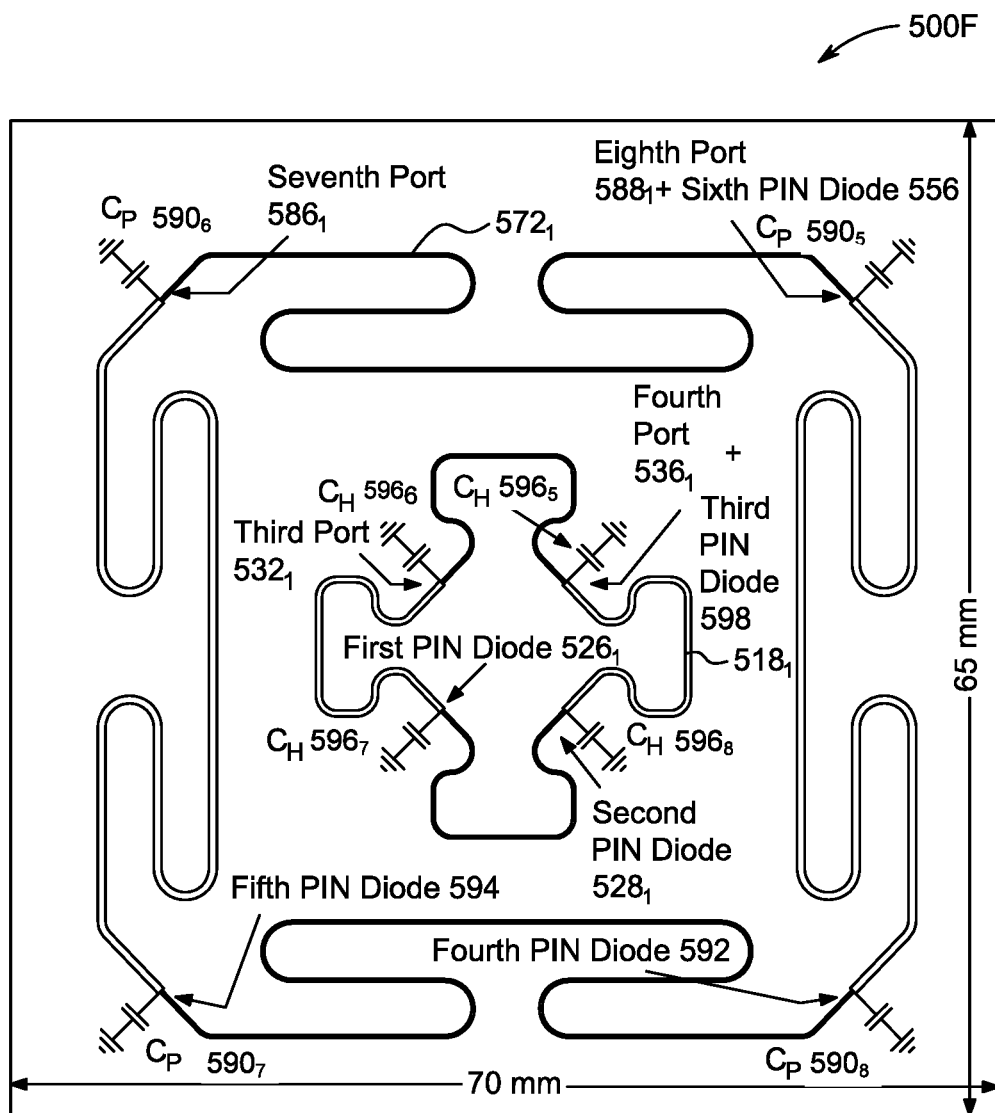
FIG. 5F is a schematic circuit diagram of an example implementation of a dual-tuned T/R switch (1H/23Na) using two concentric microstripline based hybrid couplers using a pi-equivalent circuit for both couplers at a bottom side, according to an embodiment of the present disclosure.

FIG. 5E and FIG. 5F illustrates a schematic diagram obtained by application of the transmission line theory based miniaturization technique to reduce unused space within the inner couplers and between the inner couplers and the outer couplers.

In one or more embodiments, smaller electrical length of the series microstripline in the Pi-shape equivalent circuit in FIG. 7B can be used. For the inner couplers and the outer couplers, an electrical length of 30° has been chosen. By applying the transmission line theory based miniaturization technique that was described for reducing the size of the inner coupler and the outer coupler, width (w) and length (l) of the corresponding microstripline are obtained. The w and/are the width and length of the corresponding microstriplines are provided in Table 2 and Table 3.

TABLE 2

| 78.8 MHZ COUPLER WITH $\theta_s = 30$ | | |
| --- | --- | --- |
| | Zc = 50 Ω, θ = 90° | Zc = 35.35 Ω, θ = 90° |
| Zs θs | 100Ω } ω = 0.13 mm<br>30° } l = 123 mm | 70.71Ω } ω = 0.45 mm<br>30° } l = 120 mm |
| Zo θo | 100Ω } ω = 0.13 mm<br>60° } l = 246 mm | 70.71Ω } ω = 0.45 mm<br>60° } l = 240 mm |

TABLE 3

| 298 MHZ COUPLER WITH $\theta_s = 30$ | | |
| --- | --- | --- |
| | Zc = 50 Ω, θ = 90° | Zc = 35.35 Ω, θ = 90° |
| Zs θs | 100Ω } ω = 0.13 mm<br>30° } l = 32.5 mm | 70.71Ω } ω = 0.45 mm<br>30° } l = 31.8 mm |
| Zo θo | 100Ω } ω = 0.13 mm<br>60° } l = 65 mm | 70.71Ω } ω = 0.45 mm<br>60° } l = 63.6 mm |

As similar to FIG. 5C and FIG. 5D, shunt capacitors have been added on all edges of each coupler as shown in FIG. 5E and FIG. 5F. In one example, shunt capacitor of 22 pF is used in the inner coupler, and 85 pF is used in the outer coupler, enabling reduction of space. As a result of using the transmission line theory based miniaturization technique, the dimensions of the T/R switch has been reduced to 70 mm×65 mm, which is about 70% smaller than the design described in FIG. 5A and FIG. 5B.

Referring to construction, FIG. 5E illustrates a top side 500E having an inner microstripline based hybrid coupler $508_1$ and an outer microstripline based hybrid coupler $562_1$, with the inner microstripline based hybrid coupler $508_1$ forming an inner loop, and the outer microstripline based hybrid coupler $562_1$ forming an outer loop around the inner loop sharing a common center. The inner microstripline based hybrid coupler $508_1$ includes connection to a first port $522_1$ configured to receive pulsed $^1$H RF signal power, and the outer microstripline based hybrid coupler $562_1$ includes connection to a fifth port $582_1$ configured to receive pulsed $^{23}$Na RF signal power as input signals. A second port $524_1$ is connected to the $^1$H RF coil to transmit the pulsed $^1$H RF signal power, and the sixth port $584_1$ is connected to the $^{23}$Na RF coil to transmit the pulsed $^{23}$Na RF signal power to a subject. The inner microstripline based hybrid coupler 508 includes connections to a first PIN diode $526_1$ and a second PIN diode $528_1$, and the outer microstripline based hybrid coupler $562_1$ is illustrated to have connections with a fourth PIN diode 592 and a fifth PIN diode 594. FIG. 5F illustrates an example implementation of the bottom side 500F of the T/R switch 200. Similar to the top side 500E, the bottom side 500F includes two concentric microstripline based hybrid couplers having an inner microstripline based hybrid coupler $518_1$ and an outer microstripline based hybrid coupler $572_1$. The inner microstripline based hybrid coupler $518_1$ forms an inner loop, and the outer microstripline based hybrid coupler $572_1$ forms an outer loop around the inner loop with a common center. The inner microstripline based hybrid coupler $518_1$ at the bottom side 500F includes connections to the first PIN diode $526_1$, the second PIN diode $528_1$, a third port $532_1$ connected to a first RF terminator (of 50 Ohms), and a fourth port $536_1$ connected to a $^1$H pre-amplifier along with a third PIN diode 598. The outer microstripline based hybrid coupler $572_1$ is illustrated to have connections with the fourth PIN diode 592, the fifth PIN diode 594, a seventh port $586_1$ connected to a second RF terminator, and an eighth port $588_1$ connected to $^{23}$Na pre-amplifier and a sixth PIN diode 556. According to the example implementation, the top side 500E and the bottom side 500F of the double sided microstripline based hybrid couplers are rectangular in shape.

FIG. 5E illustrates a top side 500E with a compact outer coupler having connections to a fifth port 582, a sixth port 584, a fourth PIN diode and a fifth PIN diode. The shunt capacitors $C_p$ $590_1$-$590_4$ are coupled at connections to the fifth port 582, the sixth port 584, the fourth PIN diode and the fifth PIN diode. The top side 500E also includes a compact inner coupler having connections to a first port $522_1$, a second port $524_1$, a first PIN diode $526_1$ and a second PIN diode $528_1$. The shunt capacitors $C_H$ $596_1$, $C_H$ $596_2$, $C_H$ $596_3$, and $C_H$ $596_4$, are coupled at connections to the first port $522_1$, the second port $524_1$, the first PIN diode $522_1$ and the second PIN diode $528_k$, respectively. Functioning of the T/R switch 200 implemented as 500E-500F are substantially similar to that of the T/R switch 200 implementation as 500C-500D.

Figure 6E:
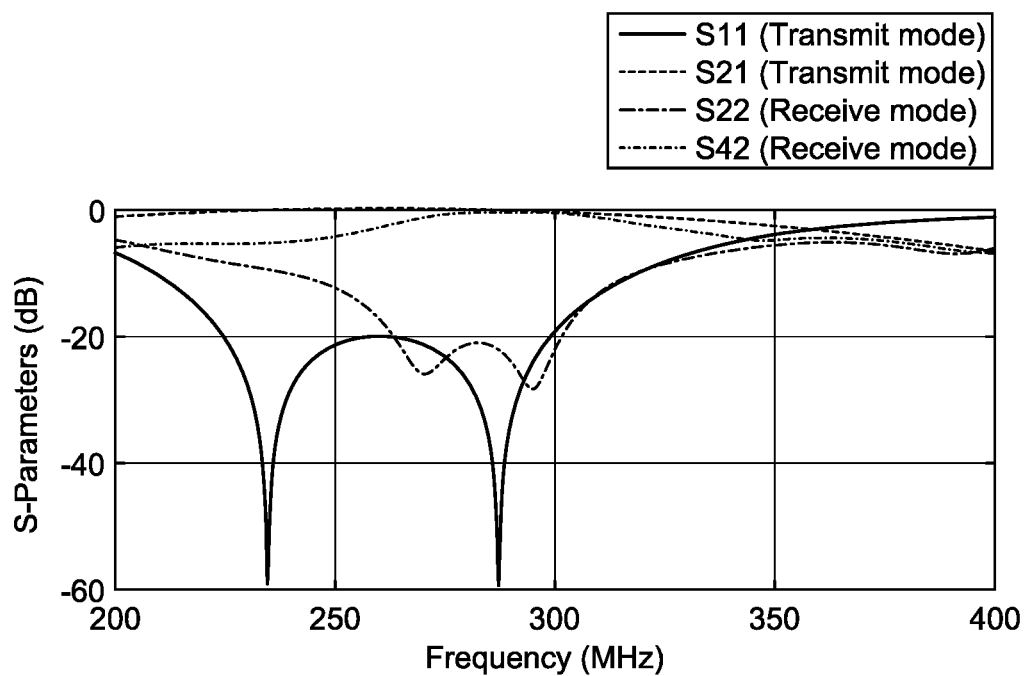
FIG. 6E illustrates EM simulation results of S-parameters for T/R switch of FIG. 5E and FIG. 5F for 1H MRI at 298 MHz, according to an embodiment of the present disclosure.
Figure 6F:
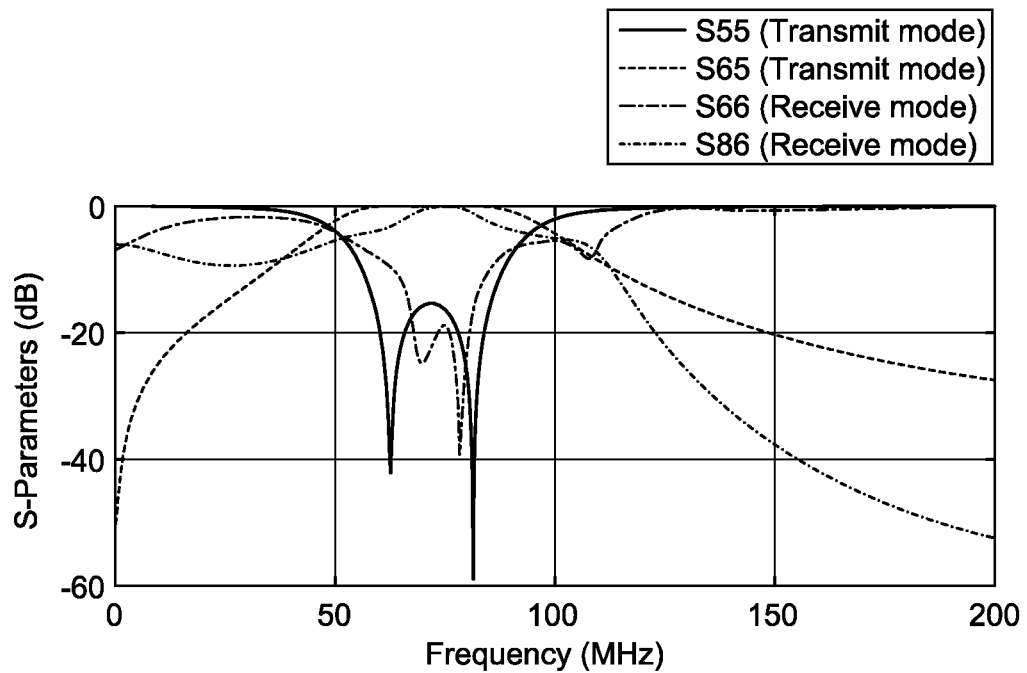
FIG. 6F illustrates EM simulation results of S-parameters for T/R switch of FIG. 5E and FIG. 5F for 23Na MRI at 78.8 MHz, according to an embodiment of the present disclosure.

FIG. 6E and FIG. 6F illustrates the EM simulation S-parameters results for the T/R switch of FIG. 5E and FIG. 5F. FIG. 6E shows the S-parameters with good matching having a low insertion loss of about 0.04 dB indicated by S21 during the transmission mode, and about 0.16 dB indicated by S42 during the receiving mode. FIG. 6F shows the S-parameters for the outer coupler (23Na coupler) during the transmission mode and the receiving mode. FIG. 6F illustrates S-parameters with good matching having a low insertion loss of about 0.03 dB indicated by S65 during the transmission mode and 0.33 dB indicated by S86 during the receiving mode. The simulation also demonstrates more than 55 dB isolation (S51) between the inner coupler and the outer coupler.

Figure 8:
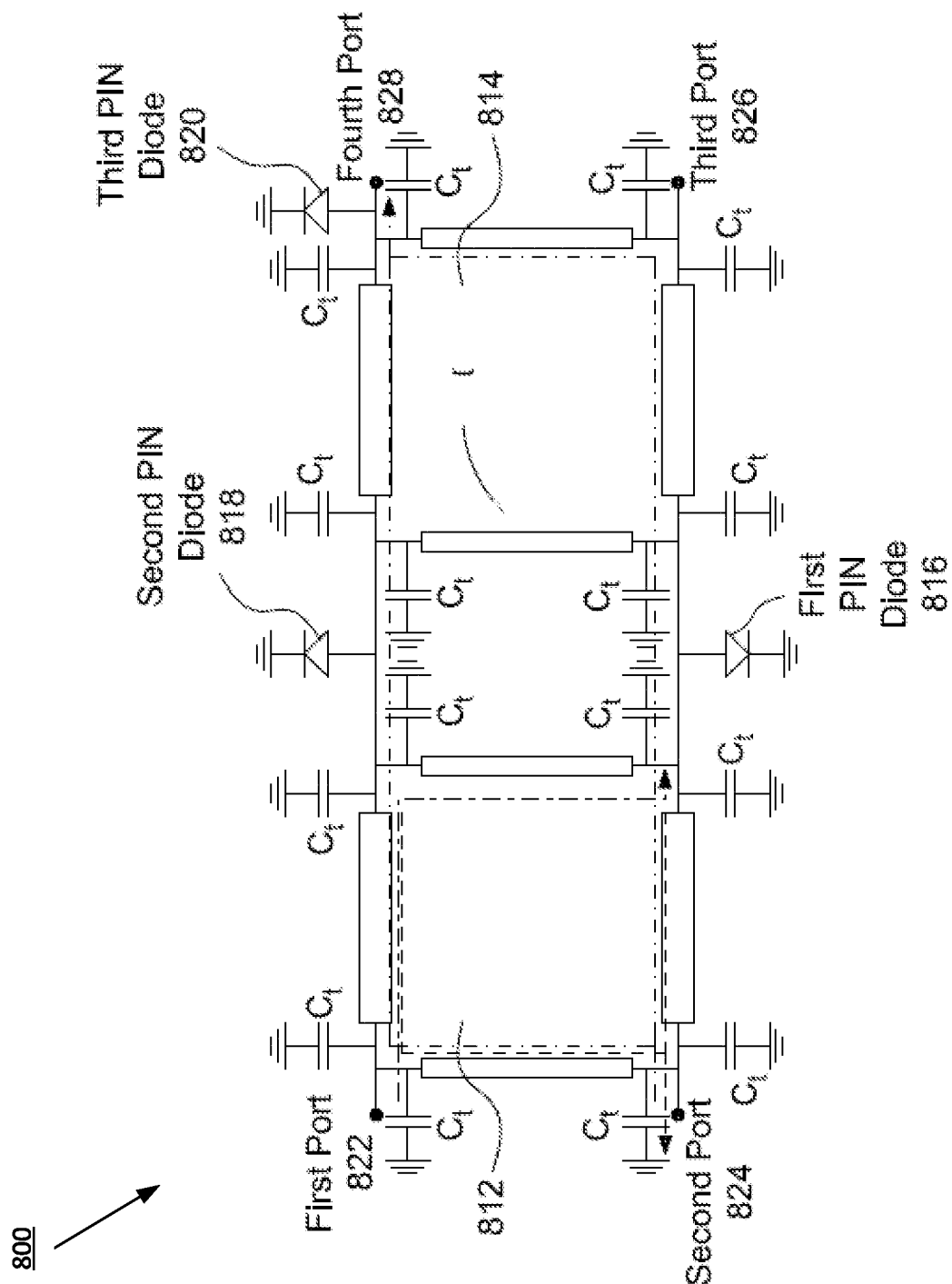
FIG. 8 is a block diagram of a multi-tuned microstripline based hybrid couplers T/R switch with tuning capabilities, according to an embodiment of the present disclosure.

FIG. 8 is a block diagram of microstripline based hybrid couplers T/R switch 800 with tuning capabilities, according to an embodiment. The construction of the microstripline based hybrid couplers T/R switch 800 is substantially similar to that of FIG. 1B. The microstripline based hybrid couplers T/R switch is composed of two microstripline based hybrid couplers. The microstripline based hybrid couplers include a top hybrid coupler 812 and a bottom hybrid coupler 814. The top hybrid coupler 812 and a bottom hybrid coupler 814 are connected to a first PIN diode 816, a second PIN diode 818. As illustrated in FIG. 8, the T/R switch 800 has four ports, a first port 822, a second port 824, a third port 824, and a fourth port 826. The first port 822 and the second port 824 are associated with the top hybrid coupler 812 and the third port 826 and the fourth port 828 are associated with the bottom hybrid coupler 814. The first port 822 is configured to receive pulsed RF signal power as an input signal. The second port 824 is connected to a RF coil. The third port 826 is connected to a RF terminator (not shown). The fourth port 828 is connected to a pre-amplifier and a third PIN diode 820. The third PIN diode 820 is connected to the fourth port 828 to increase isolation between the first port 822 and the fourth port 828 to which the pre-amplifier is connected.

In one embodiment, operating frequencies of microstripline based hybrid couplers is calculated based on the electrical length of transmission lines of a quarter wavelength. By design, microstripline based hybrid couplers are configured to function at a fundamental frequency as well as odd multiples of this frequency. The multi-tuned T/R switch 800 makes use of the fundamental frequency and a first odd multiple to be tuned to different atomic nuclei frequencies. In order to reduce the frequency tuning range, the microstripline based hybrid couplers may be designed to operate at a frequency of atomic nuclei that lies in the middle between the other common frequencies. Table 4 illustrates frequency of phosphorus atom ($^{31}$P) is considered to be the middle frequency.

TABLE 4

Different atomic nuclei frequencies at 7-Tesla with the corresponding tuning capacitors, microstripline parameters and shunt capacitor for matching network.

| Nucleus | Frequency (MHz) | Ct (pF) | L (mm) | W (mm) | Cm (pF) |
|---|---|---|---|---|---|
| $^1$H | 298 | 19.3 | 25.2 | 0.18 | 10.5 |
| $^{19}$F | 280 | 33.5 | 25.2 | 0.18 | 13.8 |
| $^{31}$P | 120.6 | 0 | 25.2 | 0.18 | 8.0 |
| $^{23}$Na | 78.8 | 27.2 | 25.2 | 0.18 | 17.3 |
| $^{13}$C | 75 | 30.7 | 25.2 | 0.18 | 20.0 |

The tuning strategy that has been followed can be summarized as follows: The fundamental frequency of the T/R switch 800 (120.6 MHz) may be tuned to lower frequencies ($^{23}$Na and $^{13}$C frequencies), whereas the first odd multiple of the fundamental frequency of around 380 MHz will be tuned to the $^1$H and $^{19}$F frequencies. Frequency tuning operation is accomplished by shunt capacitors "Ct" inserted at both ends of each microstripline in the coupler as shown in FIG. 8. The values of the tuning capacitors for different atomic nuclei frequencies are summarized in Table 1. This microstripline-based multi-tuned T/R switch 800 has been designed and simulated using simulating tools such as Computer Simulation Technology (CST) Studio Suite as shown in FIG. 9A and FIG. 9B.

Figure 9A:
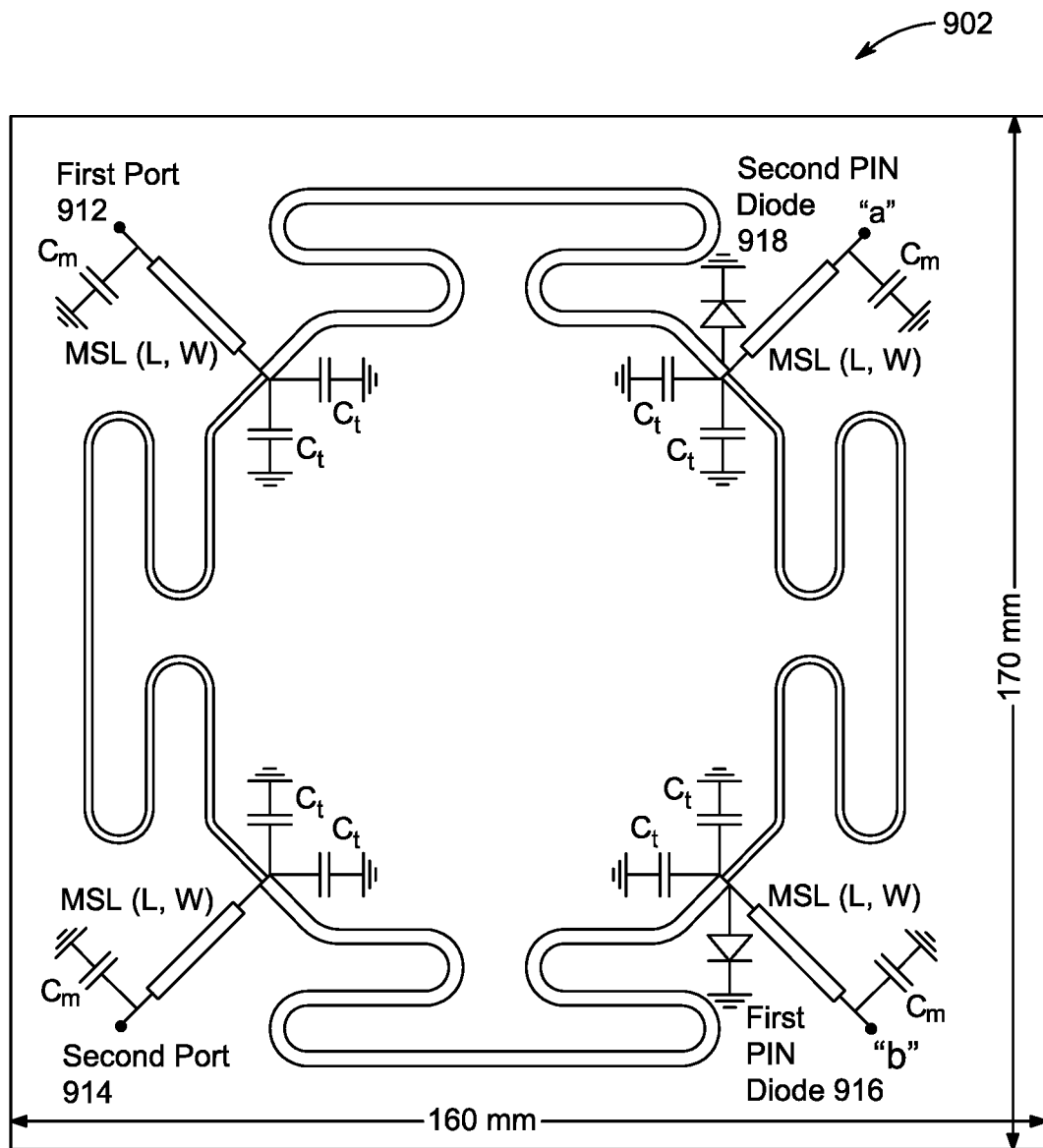
FIG. 9A illustrates a multi-tuned double-sided microstripline based hybrid couplers T/R switch at a top side, according to an embodiment of the present disclosure.
Figure 9B:
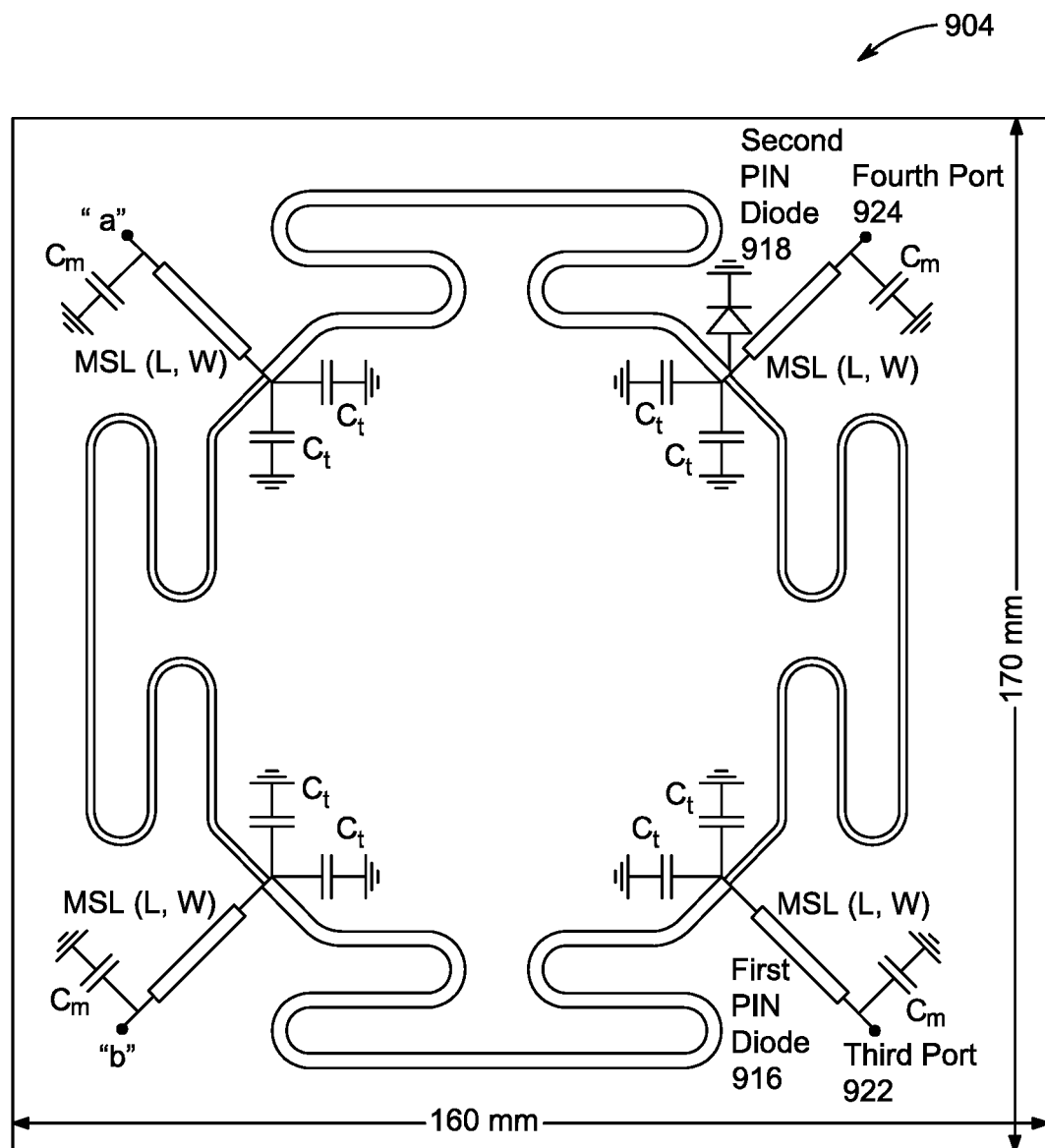
FIG. 9B illustrates a multi-tuned double-sided microstripline based hybrid couplers T/R switch at a bottom side, according to an embodiment of the present disclosure.

FIG. 9A and FIG. 9B illustrate schematic diagrams of a multi-tuned double-sided microstripline based hybrid couplers of FIG. 8, according to one embodiment. The double-sided symmetrical microstripline couplers 902 and 904 have been designed on a 160 mm×170 mm RO3010 Rogers substrate with 1.27 mm thickness each. The ground planes of the double-sided symmetrical microstripline couplers 902 and 904 are joined together (not shown), while two thin metal rods are used to connect microstripline based hybrid couplers at node "a" and "b" on a top side of 902, and on a bottom side of 904. In order to improve matching of each coupler ports, matching networks have been added for all ports and each matching network includes a microstripline and shunt capacitor ($C_m$). The parameters of microstripline length (L) and width (W) may be fixed for all frequency tuning cases. The value of $C_m$ is changed according to the operating frequency as stated in Table 4.

Specifically, FIGS. 9A and 9B illustrates an example implementation of the T/R switch 200 as a multi-tuned T/R switch 200. Further, FIG. 9A illustrates a top side 902 of the multi-tuned T/R switch 200. The top side 902 includes a first port 912 and a second port 914. While the other ends of the top side 902 are coupled to a first PIN diode 916 and a second PIN diode 918 and each end is coupled with shunt capacitors "Ct" for tuning. FIG. 9B illustrates a bottom side 904 of the multi-tuned T/R switch 200. The bottom side 904 includes a third port 922 and a fourth port 924. While the other ends of the bottom side 904 are coupled to the first PIN diode 916 and the second PIN diode 918 and each end is coupled with shunt capacitors "Ct" for tuning. Apart from tuning, the functioning of the multi-tuned T/R switch 200 of FIG. 9A and FIG. 9B are substantially similar to that of FIG. 1B. Simulation results using S-parameters of the multi-tuned T/R switch 200 described in FIGS. 9A and 9B is illustrated in FIG. 10A, FIG. 10B, FIG. 10C, FIG. 10D and FIG. 10E.

Figure 10A:
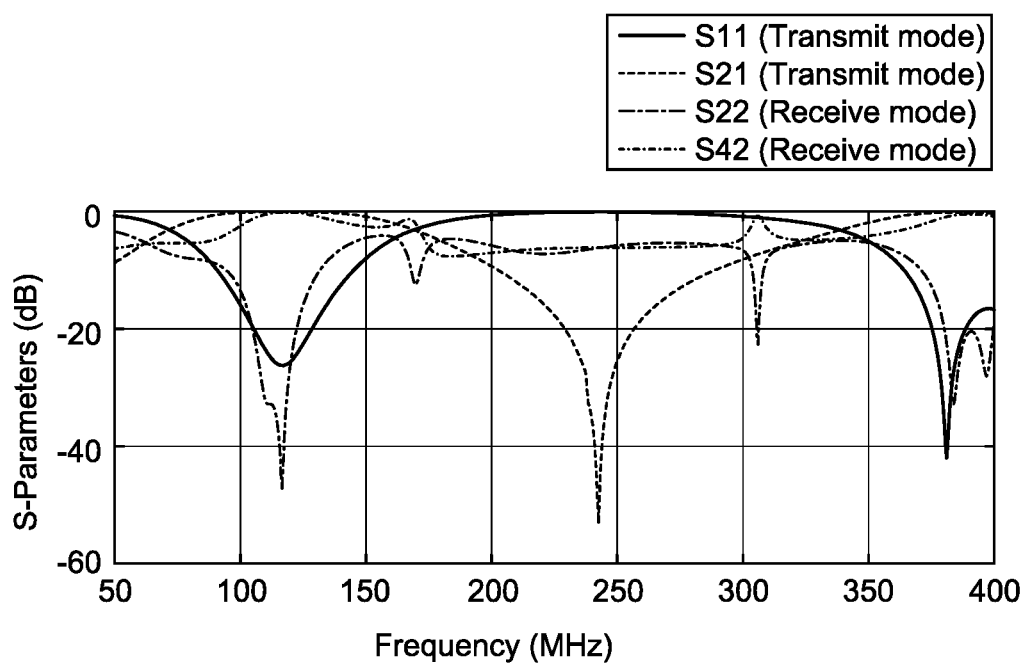
FIG. 10A illustrates S-parameter obtained from simulation at fundamental frequency of 120.6 MHz for $^{31}$P atoms, according to an embodiment of the present disclosure.
Figure 10B:
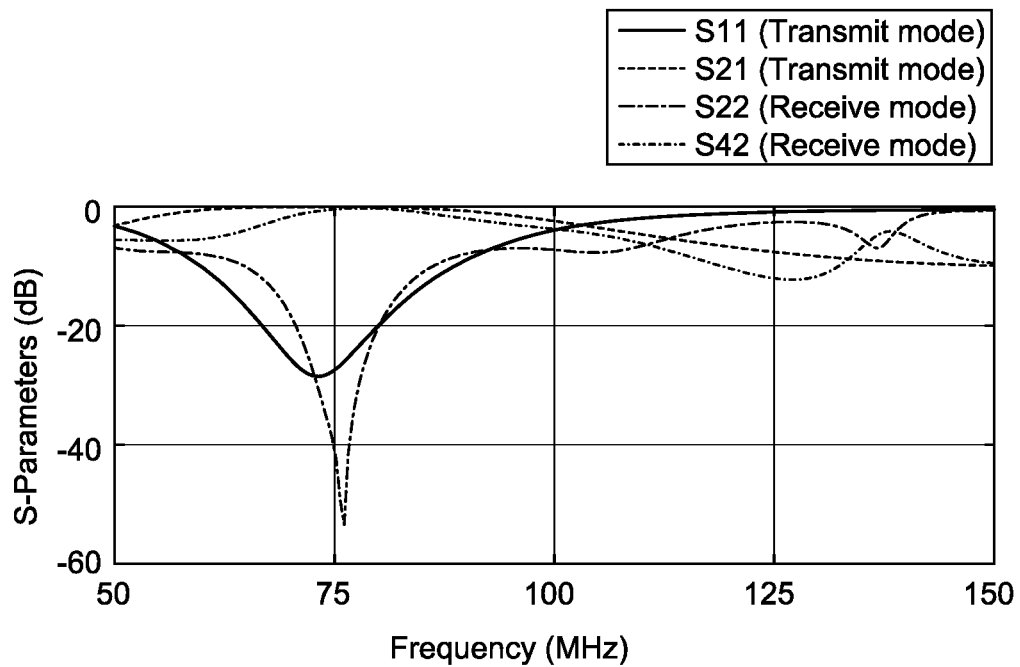
FIG. 10B illustrates S-parameter obtained from simulation at fundamental frequency of 75 MHz, for $^{13}$C atoms, according to an embodiment of the present disclosure.
Figure 10C:
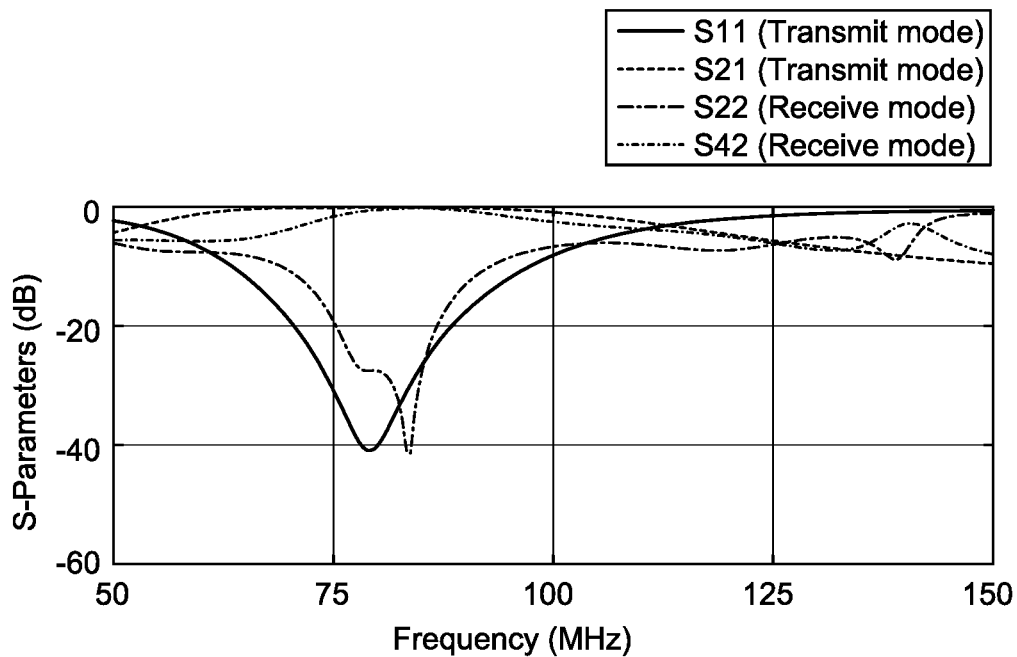
FIG. 10C illustrates S-parameter obtained from simulation at fundamental frequency of 78.8 MHz for $^{23}$Na atoms, according to an embodiment of the present disclosure.
Figure 10D:
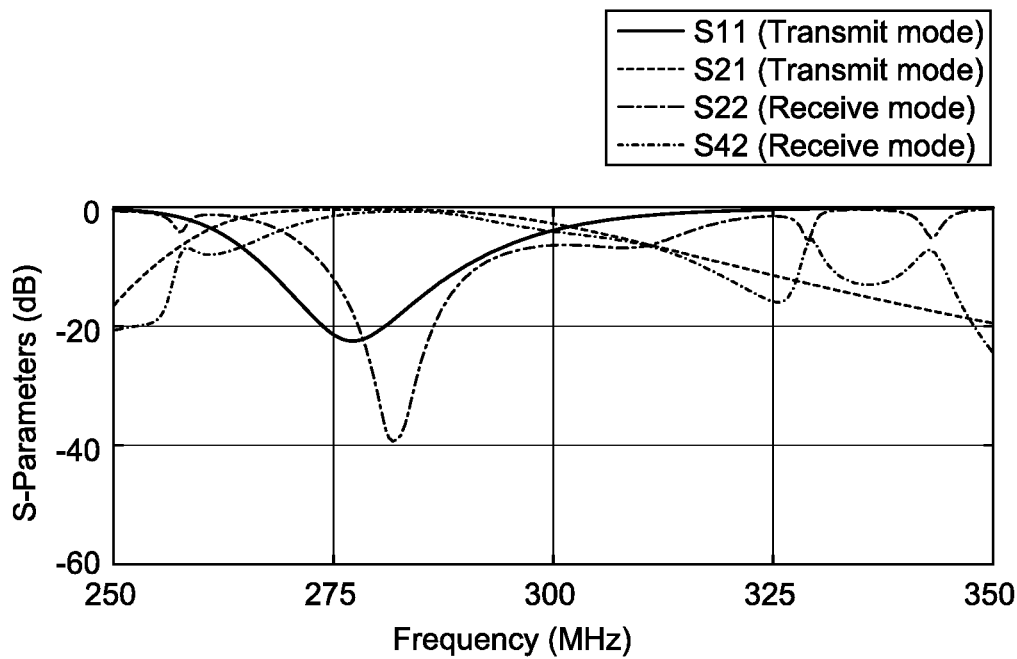
FIG. 10D illustrates S-parameter obtained from simulation at fundamental frequency of 280 MHz for $^{19}$F atoms, according to an embodiment of the present disclosure.
Figure 10E:
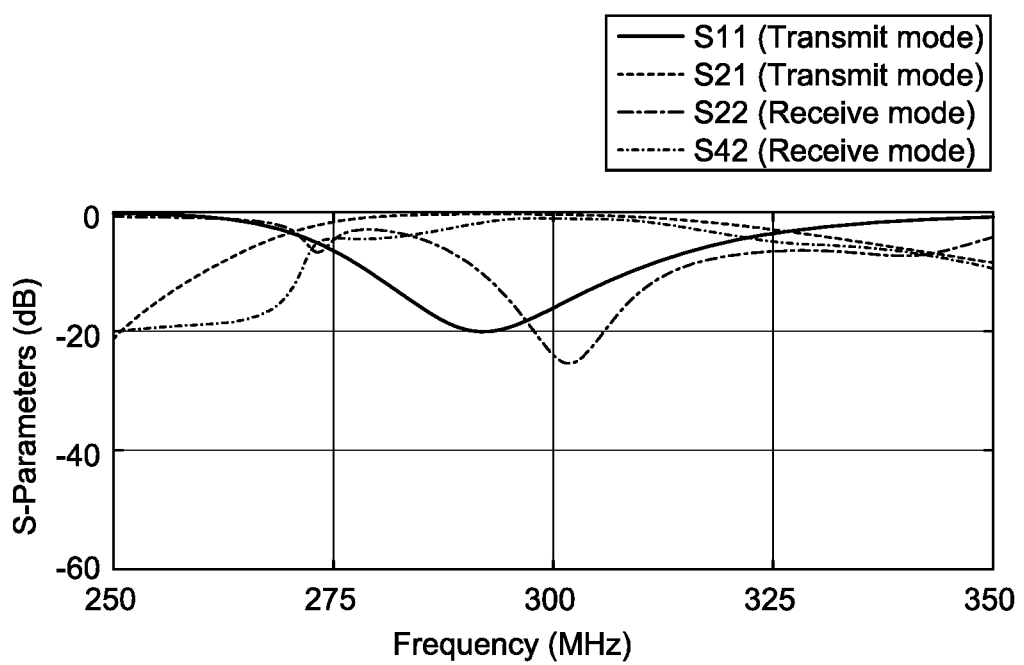
FIG. 10E illustrates S-parameter obtained from simulation at fundamental frequency of 298 MHz for $^{1}$H atoms, according to an embodiment of the present disclosure.

FIG. 10A illustrates S-parameter obtained from simulation at fundamental frequency of 120.6 MHz for $^{31}$P atoms. The S-parameters indicate a low reflection coefficient of about −25 dB, and a low insertion loss of around 0.1 dB at the first port 912 and the second port 914, respectively, during the transmission mode. During the receiving mode, low reflection coefficient of about −24 dB, as well as low insertion loss, that is, less than 0.2 dB between the second port 914 and the fourth port 924 has been identified. FIG. 10B illustrates S-parameter obtained from simulation at a fundamental frequency of 75 MHz, for $^{13}$C atoms. The S-parameters indicate low reflection coefficient of less than −25 dB and low insertion loss of about 0.12 dB at the first port 912 and the second port 914, respectively during the transmission mode. During receive, low reflection coefficient of about −40 dB, as well as low insertion loss of about 0.4 dB between the second port 914 and the fourth port 924 have been observed. FIG. 10C illustrates, S-parameter obtained from simulation at a fundamental frequency of 78.8 MHz for $^{23}$Na atoms. The S-parameters indicate a low reflection coefficient of about −40 dB and a low insertion loss of about 0.1 dB at the first port 912 and the second port 914 during the transmission mode. During the receiving mode, a low reflection coefficient of less than −25 dB, as well as negligible insertion loss of about 0.6 dB has been identified between the second port 914 and the fourth port 923. FIG. 10D illustrates S-parameter obtained from simulation at fundamental frequency of 280 MHz for $^{19}$F atoms. The S-parameters indicate a low reflection coefficient of about −20 dB, and low insertion loss of about 0.35 dB at the first port 912 and the second port 914 at the transmission mode. During the receiving mode, a low reflection coefficient of about −30 dB, as well as a low insertion loss of about 0.78 dB between the second port 914 and the fourth port 924 is observed. FIG. 10E illustrates S-parameters obtained from simulation at a fundamental frequency of 298 MHz for $^1$H atoms. The S-parameters indicate a low reflection coefficient of about −17 dB, and low insertion loss of about 0.33 dB between the first port 912 and the second port 914 has been observed during the transmission mode. During the receiving mode, a low reflection coefficient of about −20 dB, as well as a low insertion loss of about 0.6 dB between the second port 914 and the fourth port 924 have been observed.

Figure 11A:
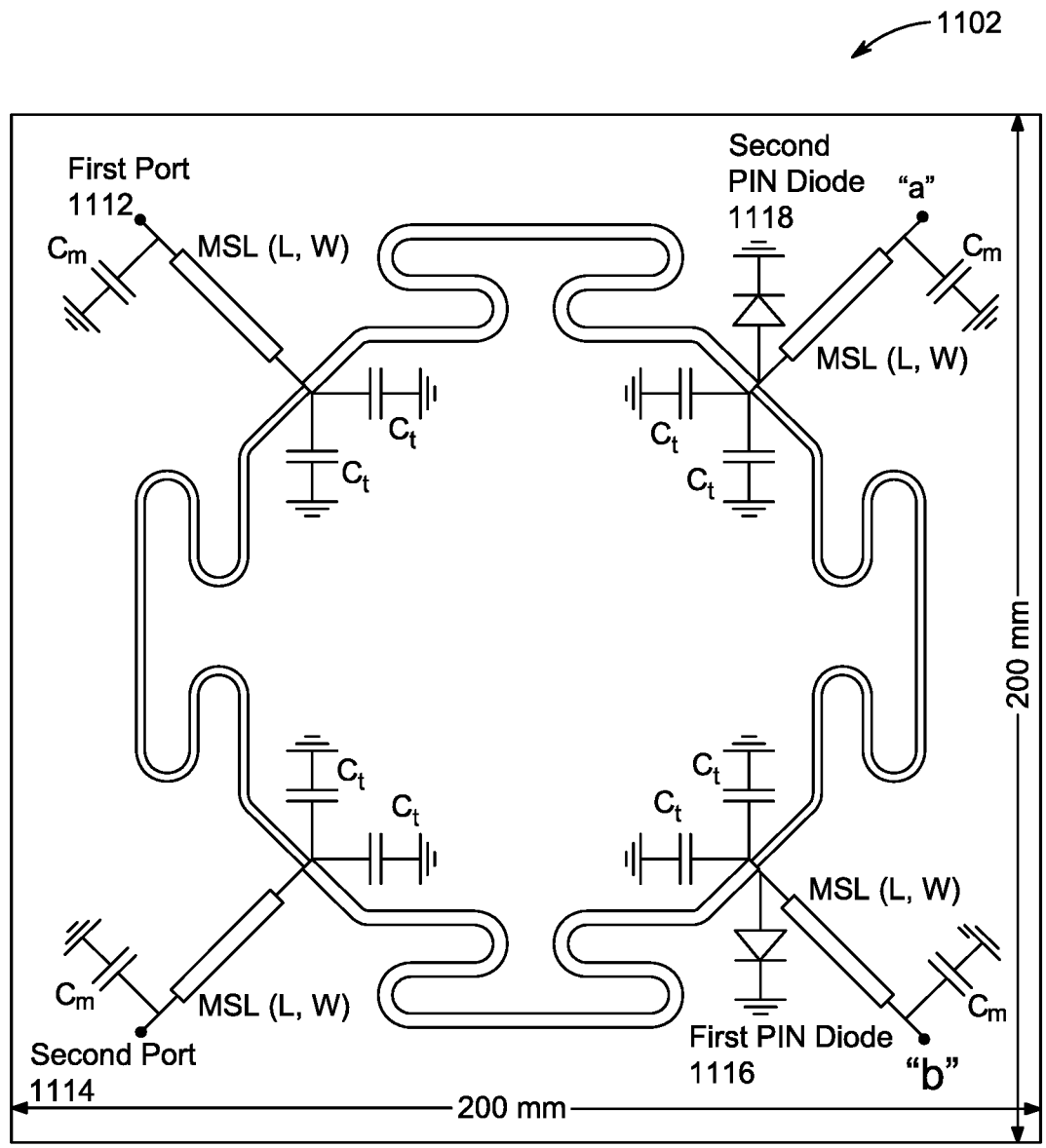
FIG. 11A illustrates a dual-resonance T/R switch for $^{1}$H/$^{23}$Na at a top side, according to an embodiment of the present disclosure.
Figure 11B:
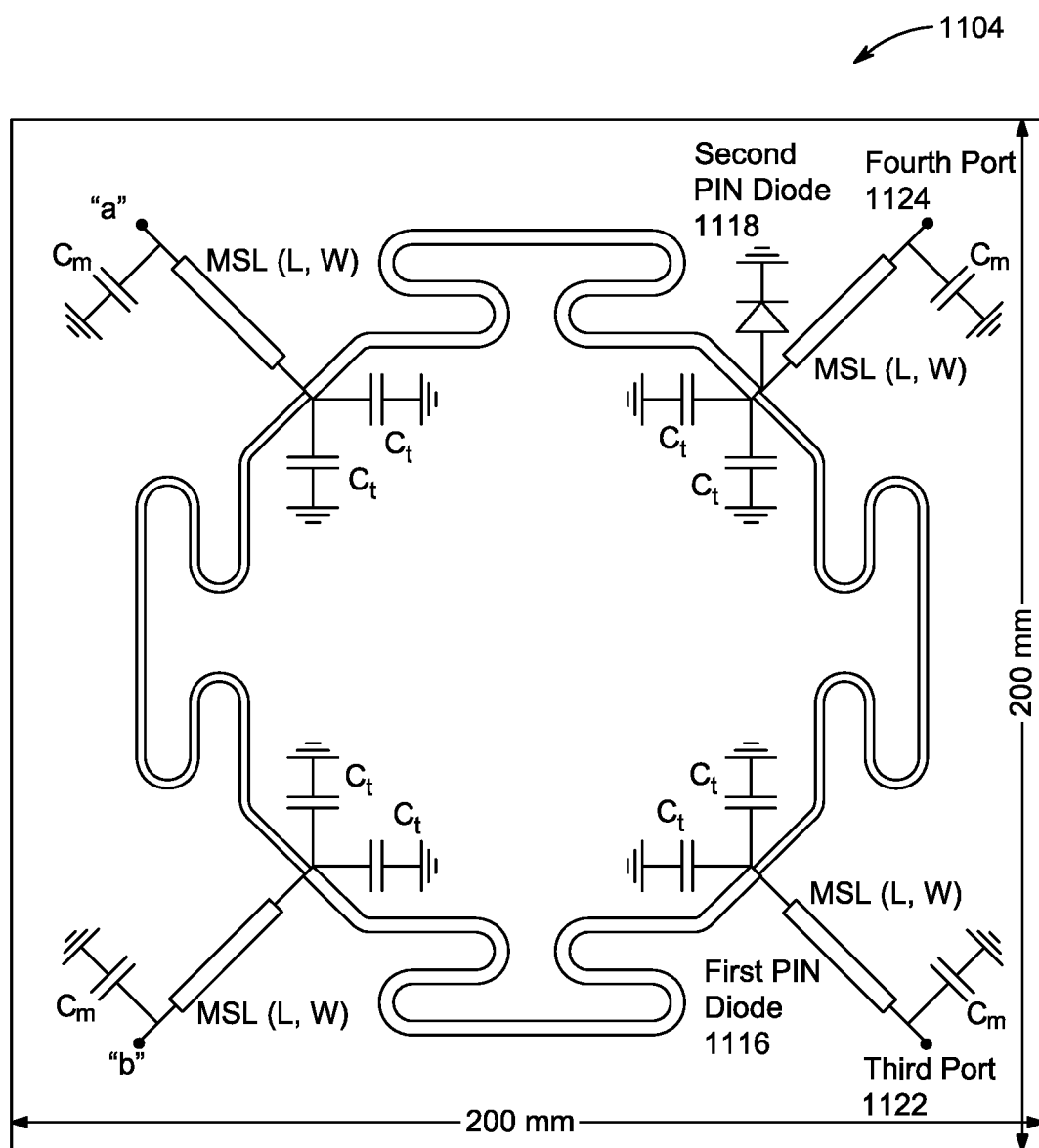
FIG. 11B illustrate a dual-resonance T/R switch for $^{1}$H/$^{23}$Na at a bottom side, according to an embodiment of the present disclosure.

FIG. 11A and FIG. 11B illustrates an example implementation of the T/R switch 200 as a dual-tuned T/R switch 200 based on double-sided microstripline based hybrid couplers for $^1$H/$^{23}$Na designed on RO3010 dielectric substrate. The dual tuned T/R 200 switch is based on design technique described in FIG. 8. The design relies on a fundamental and first odd multiple frequencies of the couplers. By accurately choosing an operating frequency of the coupler, two frequencies (the fundamental and the first odd multiple) can be tuned simultaneously using the shunt capacitors (Ct) to obtain two resonance frequencies of two common atomic nuclei. FIG. 11A illustrates a top side 1102 of the dual-tuned T/R switch 200, and FIG. 11B illustrates a bottom side 1104 of the dual-tuned T/R switch 200. The top side 1102 includes connections a first port 1112 and a second port 1114. The top side 1102 also includes connections to a first PIN diode 1116 and a second PIN diode 1118. Also, the dual-tuned T/R switch 200 includes connections with shunt capacitors "Ct" for tuning at each end. The bottom side 1104 includes connections to a third port 1122 and a fourth port 1124 and the other ends of the bottom side include connections to the first PIN diode 1112 and the second PIN diode 1114 and each includes connections to shunt capacitors "Ct" for tuning. Apart from tuning, the functioning of the dual-tuned T/R switch 200 of FIG. 11A and FIG. 11B are substantially similar to that of FIG. 1B. The couplers of FIG. 11A and FIG. 11B have been designed with an operating frequency of 131 MHz. Using the shunt capacitors Ct=60 pF, a fundamental frequency as well as a first odd multiple frequency is tuned to 78.8 MHz and 298 MHz, respectively. In order to get a compromise matching at both resonance frequencies, a microstripline with parameters of L=30 mm and W=1.2 mm has been integrated in addition to a shunt capacitor Cm=13 pF.

This method gives the T/R switch 200 the capability to be tuned to two different atomic nuclei frequencies simultaneously. The MRI scanner with the described T/R switch 200 can be used to conduct a signal resonating at two frequencies corresponding to the speed of precession of two atomic nuclei to a dual resonant MRI RF coil.

Figure 12A:
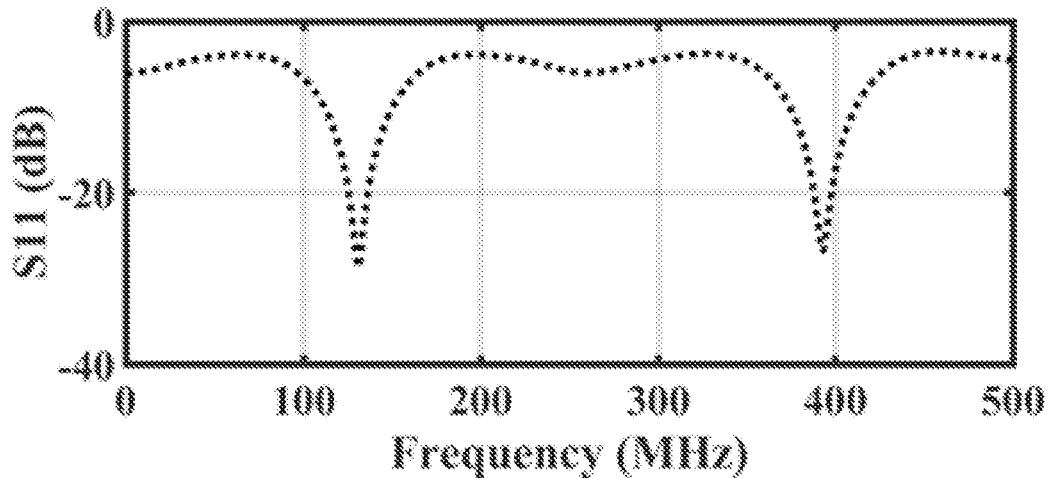
FIG. 12A illustrates S-parameters for the symmetrical microstripline-based dual-tuned T/R switch of FIG. 11A before applying tuning mechanism, according to an embodiment of the present disclosure.
Figure 12B:
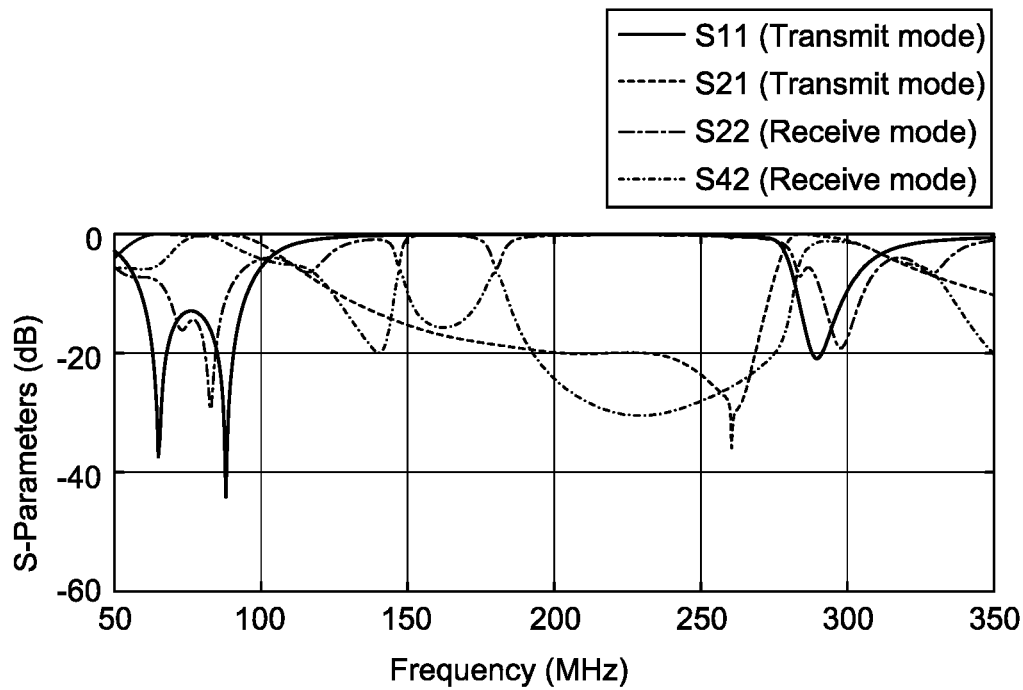
FIG. 12B illustrates S-parameters for the symmetrical microstripline-based dual-tuned T/R switch of FIG. 11A and FIG. 11B after applying a tuning mechanism, according to an embodiment of the present disclosure.

FIG. 12A illustrates S-parameter (S11) for the symmetrical microstripline-based dual-tuned T/R switch before applying the tuning mechanism. Fundamental and first odd multiple frequencies are tuned to obtain $^1$H/$^{23}$Na dual-tuned switch as shown in FIG. 12B. At 78.8 MHz for 23Na atoms, low reflection coefficient of about −13.5 dB, and low insertion loss of about 0.3 dB for the first port (shown as S11) and the second port (shown as S21), respectively during a transmission mode are achieved. During a receiving mode, low reflection coefficient of −15 dB (shown as S22) as well as low insertion loss between the second port and the fourth port of 0.3 dB (shown as S42) has been obtained. Further, at 298 MHz for $^1$H atoms, low reflection coefficient of about −11.5 dB, and as well as low insertion loss of about 0.8 dB at the first port (shown as S11) and the second port (shown as S12) have been achieved during the transmission mode. During the receiving mode, low reflection coefficient of about −19 dB as well as low insertion loss of about 1.25 dB between the second port and the fourth port have been observed.

While certain implementations have been described, these implementations have been presented by way of example only, and are not intended to limit the teachings of this disclosure. Indeed, the novel apparatuses described herein can be embodied in a variety of other forms; furthermore, various omissions, substitutions and changes in the form of the, apparatuses described herein can be made without departing from the spirit of this disclosure.

According to at least one aspect of the embodiments described above, it is possible to provide a magnetic resonance imaging apparatus.

Embodiments of the present disclosure may also be as set forth below.

In an exemplary embodiment, a magnetic resonance imaging apparatus for magnetic resonance imaging of a subject of investigation is described. The magnetic resonance imaging apparatus includes a transmit/receive switch. The transmit/receive switch includes a double sided microstripline based hybrid couplers to perform a dual-tuned switch. A top side and a bottom side of the T/R switch each include two concentric microstripline based hybrid couplers (inner and outer). The inner microstripline based hybrid coupler forms an inner loop of the two concentric microstripline based hybrid couplers. The outer microstripline based hybrid coupler forms an outer loop around the inner loop. In a transmission mode, the inner microstripline based hybrid coupler and the outer microstripline based hybrid coupler at the top side of the double sided microstripline based hybrid couplers are activated. In a receiving mode, the inner microstripline based hybrid coupler and the outer microstripline based hybrid coupler at the top side and at the bottom side of the double sided microstripline based hybrid couplers are activated.

In another exemplary embodiment, a magnetic resonance imaging apparatus for magnetic resonance imaging of a subject of investigation is described. The magnetic resonance imaging apparatus includes a transmit/receive switch. The transmit/receive switch includes a double sided microstripline based hybrid couplers to perform multi-tuned T/R switch. A top side and a bottom side of the T/R switch each include one microstripline based hybrid coupler. The ports of each hybrid coupler are connected to shunt capacitors (tuning capacitors). The shunt capacitors are used to tune the resonance frequency. The first port associated with the top hybrid coupler configured to receive pulsed radio frequency signal power as an input signal. The second port associated with the top hybrid coupler connected to a radio frequency coil. The third port associated with the bottom hybrid coupler connected to a radio frequency terminator. The fourth port associated with the bottom hybrid coupler connected to a pre-amplifier. In another exemplary embodiment, a transmit/receive switching device is described.

The transmit/receive switch device includes a double sided microstripline based hybrid couplers to perform simultaneous dual-tuned T/R switch. It can handle a signal of two resonance frequencies to/from one dual resonant RF coil (or two single resonant RF coils) at the same time, and without tuning. A top side and a bottom side of the T/R switch each include one microstripline based hybrid coupler. The ports of each hybrid coupler are connected with shunt capacitors. The first port associated with the top hybrid coupler configured to receive pulsed radio frequency signal power as an input signal. The second port associated with the top hybrid coupler connected to a radio frequency coil. The third port associated with the bottom hybrid coupler connected to a radio frequency terminator. The fourth port associated with the bottom hybrid coupler connected to a pre-amplifier.

Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A magnetic resonance imaging medical device for imaging a subject, comprising:
   a magnet assembly comprising a radio frequency coil;
   a dual-tuned transmit/receive (T/R) switch electrically connected to the radio frequency coil, the dual-tuned T/R switch comprising:
   a top side and a bottom side, each of the top side and the bottom side includes two concentric microstripline based hybrid couplers, and each of the two concentric microstripline based hybrid couplers includes an inner microstripline based hybrid coupler and an outer microstripline based hybrid coupler, the inner microstripline based hybrid coupler forms an inner loop of the two concentric microstripline based hybrid couplers and the outer microstripline based hybrid coupler forms an outer loop around the inner loop,
   in a transmission mode, for the dual-tuned T/R switch:
   the inner microstripline based hybrid coupler and the outer microstripline based hybrid coupler at the top side of the dual-tuned T/R switch are activated;
   in a receiving mode, for the dual-tuned T/R switch:
   the inner microstripline based hybrid coupler and the outer microstripline based hybrid coupler at the top side and at the bottom side of the dual-tuned T/R switch are activated.

2. The magnetic resonance imaging medical device of claim 1, wherein the top side and the bottom side of the dual-tuned T/R switch are of equal sizes.

3. The magnetic resonance imaging medical device of claim 1, wherein the inner loop and the outer loop share a common center.

4. The magnetic resonance imaging medical device of claim 1, wherein the top side and the bottom side of the dual-tuned T/R switch are rectangular in shape, with a length of 170 millimeter (mm) and a width of 160 mm.

5. The magnetic resonance imaging medical device of claim 1, wherein the inner microstripline based hybrid coupler has a different shape in comparison to the outer microstripline based hybrid coupler.

6. The magnetic resonance imaging medical device of claim 1, wherein the inner microstripline based hybrid coupler at the top side includes connections to a first port configured to receive pulsed radio frequency signal power as an input signal, a second port connected to the radio frequency coil, a first diode and a second diode.

7. The magnetic resonance imaging medical device of claim 6, wherein the inner microstripline based hybrid coupler at the bottom side includes connections to the first diode, the second diode, a third diode, a third port connected to a radio frequency terminator and a fourth port connected to a pre-amplifier.

8. The magnetic resonance imaging medical device of claim 7, wherein the outer microstripline based hybrid coupler at the top side includes connections to a fifth port configured to receive pulsed radio frequency signal power as another input signal, a sixth port connected to another radio frequency coil, a fourth diode and a fifth diode.

9. The magnetic resonance imaging medical device of claim 8, wherein the outer microstripline based hybrid coupler at the bottom side includes connections to the fourth diode, the fifth diode, a sixth diode, a seventh port connected to another radio frequency terminator and an eighth port connected to another pre-amplifier.

* * * * *